(12) United States Patent
Shizuno et al.

(10) Patent No.: US 9,433,085 B2
(45) Date of Patent: Aug. 30, 2016

(54) ELECTRONIC COMPONENT, METHOD FOR MANUFACTURING THE SAME AND METHOD FOR MANUFACTURING MULTILAYER PRINTED WIRING BOARD

(71) Applicant: IBIDEN CO., LTD., Ogaki-shi (JP)

(72) Inventors: Yoshinori Shizuno, Ogaki (JP); Makoto Terui, Ogaki (JP); Masatoshi Kunieda, Ogaki (JP); Asuka Ii, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 72 days.

(21) Appl. No.: 14/259,522

(22) Filed: Apr. 23, 2014

(65) Prior Publication Data

US 2014/0311780 A1 Oct. 23, 2014

(30) Foreign Application Priority Data

Apr. 23, 2013 (JP) ................................ 2013-090389

(51) Int. Cl.
*H05K 1/00* (2006.01)
*H05K 1/02* (2006.01)
*H05K 3/46* (2006.01)

(52) U.S. Cl.
CPC ............ *H05K 1/0269* (2013.01); *H05K 3/4644* (2013.01); *H05K 2201/09918* (2013.01); *H05K 2203/166* (2013.01)

(58) Field of Classification Search
CPC ............. H01K 1/11; H01K 1/16; H05K 3/10; H05K 3/30; H05K 3/32; H05K 3/46; H01L 21/02; H01L 21/027; H01L 21/56; H01L 21/76; H01L 21/60; H01L 21/70; H01L 23/00; H01L 23/48; H01L 23/52; H01L 23/532; H01L 23/544; H01L 31/02; H01L 31/0232; G02B 6/36; G02B 6/132

USPC .................. 174/258, 255, 260, 262; 361/764; 438/132, 197, 400, 401, 462, 424, 585, 438/601, 687, 694, 712; 257/432, 459, 532, 257/506, 734, 758, 737, 792, 797; 430/5, 430/311, 319, 321; 267/100; 29/832, 846; 385/88

See application file for complete search history.

(56) References Cited

U.S. PATENT DOCUMENTS 5,538,924 A * 7/1996 Chen ................... H01L 23/5256 148/DIG. 55
5,567,643 A * 10/1996 Lee ..................... H01L 23/5256 257/E23.149
5,830,799 A * 11/1998 Ammo .............. H01L 21/26513 148/DIG. 102
5,869,383 A * 2/1999 Chien ................ G03F 7/70358 257/E21.596
6,392,300 B1 * 5/2002 Koike ................. H01L 23/5258 257/734

(Continued)

FOREIGN PATENT DOCUMENTS

WO WO 2007/129545 11/2007

*Primary Examiner* — Xiaoliang Chen
(74) *Attorney, Agent, or Firm* — Oblon, McClelland, Maier & Neustadt, L.L.P.

(57) ABSTRACT

An electronic component includes an insulation layer, an alignment mark positioned on a first surface of the insulation layer, and an adhesive layer including an optically opaque agent and formed on the first surface of the insulation layer or a second surface of the insulation layer on the opposite side with respect to the first surface of the insulation layer. The adhesive layer has an opening portion formed at the position corresponding to the alignment mark such that the opening portion exposes the alignment mark directly or through the insulation layer.

20 Claims, 22 Drawing Sheets

(56) References Cited

U.S. PATENT DOCUMENTS

| | | | | |
|---|---|---|---|---|
| 6,492,269 B1* | 12/2002 | Liu | H01L 21/2885 | 257/E21.175 |
| 6,818,524 B1* | 11/2004 | Yang | H01L 21/31144 | 257/E21.257 |
| 6,979,651 B1* | 12/2005 | Hellig | H01L 21/3081 | 257/E21.232 |
| 7,375,289 B2 | 5/2008 | Hiramatsu | H05K 3/0035 | 174/255 |
| 9,110,237 B2* | 8/2015 | Shibata | G02B 6/132 | |
| 2002/0048928 A1* | 4/2002 | Nakagawa | H01L 21/7682 | 438/619 |
| 2002/0098707 A1* | 7/2002 | Ning | G03F 9/7076 | 438/712 |
| 2002/0123212 A1* | 9/2002 | Kunikiyo | H01L 21/26506 | 438/585 |
| 2002/0142235 A1* | 10/2002 | Hamanaka | G03F 1/144 | 430/5 |
| 2003/0008472 A1* | 1/2003 | Yoshimura | H01L 21/76264 | 438/400 |
| 2003/0017707 A1* | 1/2003 | Yamashita | H01L 23/544 | 438/694 |
| 2003/0052384 A1* | 3/2003 | Sato | H01L 21/76224 | 257/506 |
| 2003/0052440 A1* | 3/2003 | Tsuura | H01L 23/5258 | 267/100 |
| 2003/0054597 A1* | 3/2003 | Kuroi | H01L 21/762 | 438/197 |
| 2003/0127751 A1* | 7/2003 | Yamada | H01L 23/544 | 257/797 |
| 2005/0069815 A1* | 3/2005 | Takeishi | H01L 21/0275 | 430/311 |
| 2005/0101107 A1* | 5/2005 | Ohto | H01L 23/544 | 438/462 |
| 2005/0186753 A1* | 8/2005 | Chen | G06F 9/708 | 438/401 |
| 2005/0186756 A1* | 8/2005 | Yabe | H01L 23/544 | 438/424 |
| 2006/0027926 A1* | 2/2006 | Kirikoshi | H01L 23/522 | 257/758 |
| 2006/0103035 A1* | 5/2006 | Maruyama | H01J 37/3045 | 257/797 |
| 2006/0125101 A1* | 6/2006 | Kirikoshi | H01L 23/522 | 257/758 |
| 2007/0164432 A1* | 7/2007 | Wakisaka | H01L 23/3114 | 257/737 |
| 2008/0038897 A1* | 2/2008 | Suzuki | G03F 9/7076 | 438/401 |
| 2009/0186305 A1* | 7/2009 | Hodono | G02B 6/4202 | 430/321 |
| 2009/0205202 A1* | 8/2009 | Tanaka | H01L 24/18 | 29/834 |
| 2009/0205859 A1* | 8/2009 | Tanaka | H01L 24/18 | 174/260 |
| 2009/0231820 A1* | 9/2009 | Tanaka | H01L 23/49822 | 361/764 |
| 2009/0242252 A1* | 10/2009 | Tanaka | H01L 23/5389 | 174/260 |
| 2009/0244865 A1* | 10/2009 | Tanaka | H01L 23/5389 | 361/764 |
| 2009/0269704 A1* | 10/2009 | Hodono | G02B 6/13 | 430/319 |
| 2009/0293271 A1* | 12/2009 | Tanaka | H01L 23/49827 | 29/832 |
| 2009/0309186 A1* | 12/2009 | Inoue | H01L 23/5223 | 257/532 |
| 2010/0003771 A1* | 1/2010 | Nagai | H01L 21/67092 | 438/15 |
| 2010/0007035 A1* | 1/2010 | Shimada | H01L 23/544 | 257/792 |
| 2010/0104246 A1* | 4/2010 | Hodono | G02B 6/4224 | 385/88 |
| 2010/0129036 A1* | 5/2010 | Hodono | B32B 38/1841 | 385/88 |
| 2010/0230773 A1* | 9/2010 | Nakazawa | H01L 27/14632 | 257/459 |
| 2011/0127629 A1* | 6/2011 | Yorikado | H01L 27/14603 | 257/432 |
| 2011/0186962 A1* | 8/2011 | Moriyama | H01L 24/03 | 257/529 |
| 2012/0170240 A1* | 7/2012 | Tanaka | H01L 23/5389 | 361/783 |
| 2012/0313236 A1* | 12/2012 | Wakiyama | H01L 23/544 | 257/734 |
| 2013/0160290 A1* | 6/2013 | Maeda | H05K 3/10 | 29/846 |
| 2013/0161079 A1* | 6/2013 | Maeda | H05K 1/0298 | 174/255 |
| 2013/0181344 A1* | 7/2013 | Yanase | H01L 21/486 | 257/737 |
| 2013/0232784 A1* | 9/2013 | Hida | H05K 3/0094 | 29/852 |
| 2014/0225193 A1* | 8/2014 | Chu | H01L 29/66742 | 257/347 |

* cited by examiner 12 adhesive 15 opening

ELECTRONIC COMPONENT, METHOD FOR MANUFACTURING THE SAME AND METHOD FOR MANUFACTURING MULTILAYER PRINTED WIRING BOARD

CROSS-REFERENCE TO RELATED APPLICATIONS

The present application is based upon and claims the benefit of priority to Japanese Patent Application No. 2013-090389, filed Apr. 23, 2013, the entire contents of which are incorporated herein by reference.

BACKGROUND OF THE INVENTION

1. Field of the Invention

The present invention relates to an electronic component, a method for manufacturing the same and a method for manufacturing a multilayer printed wiring board.

2. Description of Background Art

In international patent publication 2007/129545, technology for forming pads on a multilayer printed wiring board is proposed. A multilayer printed wiring board in international patent publication 2007/129545 has a built-in multilayer substrate in which conductive patterns are formed at a fine pitch. Through the built-in multilayer substrate, the lead terminals of an IC chip to be mounted are electrically connected to the circuits formed in the multilayer printed wiring board. In such a multilayer printed wiring board, the multilayer substrate is positioned in the portion where the IC chip is to be mounted, thereby enabling finer wiring in that portion. Accordingly, an IC chip with lead terminals arrayed at fine intervals is mounted accurately. The contents of international patent publication 2007/129545 are incorporated herein in this application.

SUMMARY OF THE INVENTION

According to one aspect of the present invention, an electronic component includes an insulation layer, an alignment mark positioned on a first surface of the insulation layer, and an adhesive layer including an optically opaque agent and formed on the first surface of the insulation layer or a second surface of the insulation layer on the opposite side with respect to the first surface of the insulation layer. The adhesive layer has an opening portion formed at the position corresponding to the alignment mark such that the opening portion exposes the alignment mark directly or through the insulation layer.

According to another aspect of the present invention, a method for manufacturing an electronic component includes forming an insulation layer having an alignment mark on a first surface of the insulation layer, forming an adhesive layer including an optically opaque agent on the first surface of the insulation layer or a second surface of the insulation layer on an opposite side with respect to the first surface of the insulation layer, and forming an opening portion in the adhesive layer at the position corresponding to the alignment mark such that the opening portion exposes the alignment mark directly or through the insulation layer.

According to yet another aspect of the present invention, a method for manufacturing a multilayer printed wiring board includes forming a buildup layer including insulation layers and conductive layers, positioning an electronic component having an alignment mark to a position on a surface of the buildup layer based on the alignment mark of the electronic component, mounting the electronic component to the surface of the buildup layer in the position, and forming an outer insulation layer on the surface of the buildup layer such that the outer insulation layer covers the electronic component mounted on the surface of the buildup layer. The electronic component has an insulation layer, the alignment mark positioned on a first surface of the insulation layer, and an adhesive layer including an optically opaque agent and formed on the first surface of the insulation layer or a second surface of the insulation layer on the opposite side with respect to the first surface of the insulation layer, and the adhesive layer has an opening portion formed at the position corresponding to the alignment mark such that the opening portion exposes the alignment mark directly or through the insulation layer.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
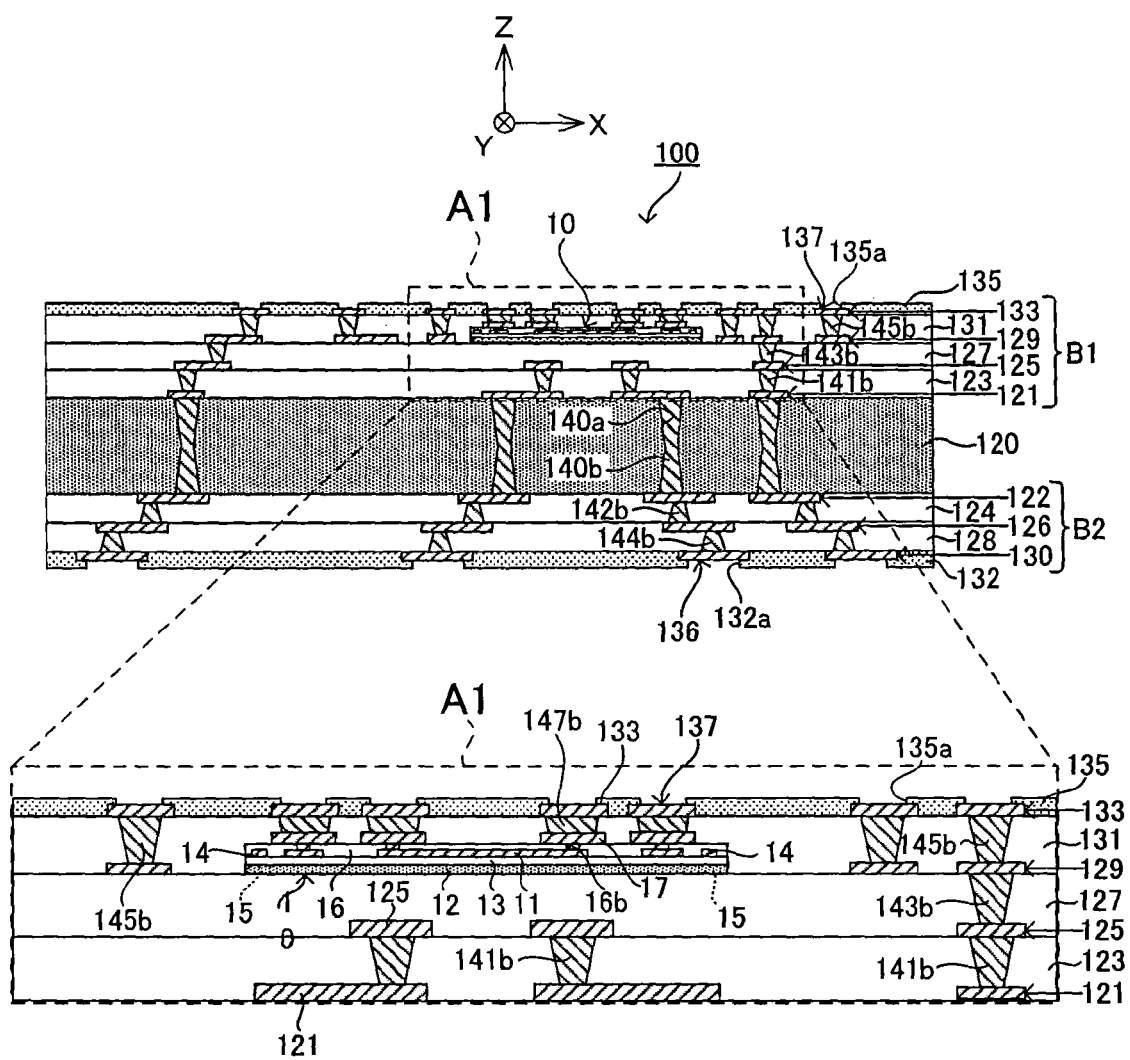
FIG. 1 shows a cross-sectional view of the entire structure of a multilayer printed wiring board according to an embodiment of the present invention and also shows an enlarged view of the main portion.

The embodiments will now be described with reference to the accompanying drawings, wherein like reference numerals designate corresponding or identical elements throughout the various drawings.

To simplify understanding, XYZ coordinates are set and referred to appropriately. Arrow (Z) indicates a lamination direction of an electronic component or a multilayer printed wiring board (or a thickness direction of the electronic component and the multilayer printed wiring board) corresponding to a direction along a normal line to main surfaces (upper and lower surfaces) of the electronic component and the multilayer printed wiring board. On the other hand, arrows (X) and (Y) each indicate a direction perpendicular to a lamination direction (or a direction toward a side of each layer). The main surfaces of the electronic component and the multilayer printed wiring board are on the (X-Y) plane. Side surfaces of the electronic component and the multilayer printed wiring board are on the (X-Z) plane or the (Y-Z) plane.

Two main surfaces respectively facing in directions along opposing normal lines are referred to as a first main surface (+Z side surface) and a second main surface (−Z side surface). Namely, a main surface opposite the first main surface is the second surface, and a main surface opposite the second main surface is the first main surface.

"Optically transparent" indicates that the transmission coefficient of light rays going through the subject is 70% or higher, for example, and "optically opaque" indicates that the transmission coefficient of the light rays is lower than 70%, for example. "Light rays" include visible rays, infrared rays and ultraviolet rays. What is generally referred to as "semi-transparent" is included in the term "optically opaque."

"Plating" indicates a step for forming a metal layer, but also includes the resultant metal and metal layer. Plating includes wet plating such as electroless plating and electrolytic plating as well as dry plating such as physical vapor deposition (PVD) and chemical vapor deposition (CVD).

Conductive patterns include wiring of a conductive circuit (including ground), a pad, a land, a via conductor or the like, or may also include a plain conductive pattern that does not form a conductive circuit.

Holes are not limited to penetrating holes, but also include non-penetrating holes. Holes include a via hole, a through hole and the like. The conductor formed in a via hole is referred to as a via conductor, and the conductor formed in a through hole is referred to as a through-hole conductor.

Multilayer printed wiring board 100 of the present embodiment has core substrate 120, first buildup layer (B1), second buildup layer (B2), solder-resist layer 135 and solder-resist layer 132, as shown in the (X-Z) cross section in FIG. 1.

First buildup layer (B1) has conductive pattern 121, insulation layer 123, via conductor (141b), conductive pattern 125, insulation layer 127, via conductor (143b), conductive pattern 129, insulation layer 131, via conductor (145b) and conductive pattern 133. Electronic component 10 is mounted inside insulation layer 131.

Core substrate 120 is made of, for example, glass-epoxy resin (hereinafter referred to as "glass epoxy"). In core substrate 120, hole (140a) (through hole) is formed by using laser light, for example. Core substrate 120 has through-hole conductor (140b) formed by filling copper plating, for example, in hole (140a). Through-hole conductor (140b)

electrically connects first main-surface side conductive pattern 121 and second main-surface side conductive pattern 122.

Insulation layer 124 is formed to cover conductive pattern 122. Via conductor (142b) is formed in insulation layer 124 to penetrate through insulation layer 124. Conductive pattern 126 is formed on the second main-surface side of insulation layer 124. Conductive pattern 126 is connected to via conductor (142b). Insulation layer 128 is formed to cover conductive pattern 126. Via conductor (144b) is formed in insulation layer 128 to penetrate through insulation layer 128. Conductive pattern 130 is formed on the second main-surface side of insulation layer 128. Conductive pattern 130 is connected to via conductor (144b). Second buildup layer (B2) is made up of conductive pattern 122, insulation layer 124, via conductor (142b), conductive pattern 126, insulation layer 128, via conductor (144b) and conductive pattern 130.

On the second main-surface side of insulation layer 128, solder-resist layer 132 is formed, having exposing portion (132a) to expose conductive pattern 130. The exposed portion of conductive pattern 130 becomes pad 136.

Main portion (A1) of multilayer printed wiring board 100 of the present embodiment is enlarged and shown in the lower portion of FIG. 1. Described in further detail, insulation layer 123 is formed to cover conductive pattern 121 formed on the first main-surface side of core substrate 120 in multilayer printed wiring board 100 of the present embodiment. Via conductor (141b) is formed in insulation layer 123 to penetrate through insulation layer 123. Conductive pattern 125 is formed on the first main-surface side of insulation layer 123. Conductive pattern 125 is connected to via conductor (141b). Insulation layer 127 is formed to cover conductive pattern 125. Via conductor (143b) is formed in insulation layer 127 to penetrate through insulation layer 127.

Conductive pattern 129 is formed on the first main-surface side of insulation layer 127. Conductive pattern 129 is connected to via conductor (143b). Also, electronic component 10 is mounted on the first main-surface side of insulation layer 127. Insulation layer 131 is formed to cover conductive pattern 129 and electronic component 10. Via conductor (145b) is formed in insulation layer 131 to penetrate through insulation layer 131.

Figure 2:
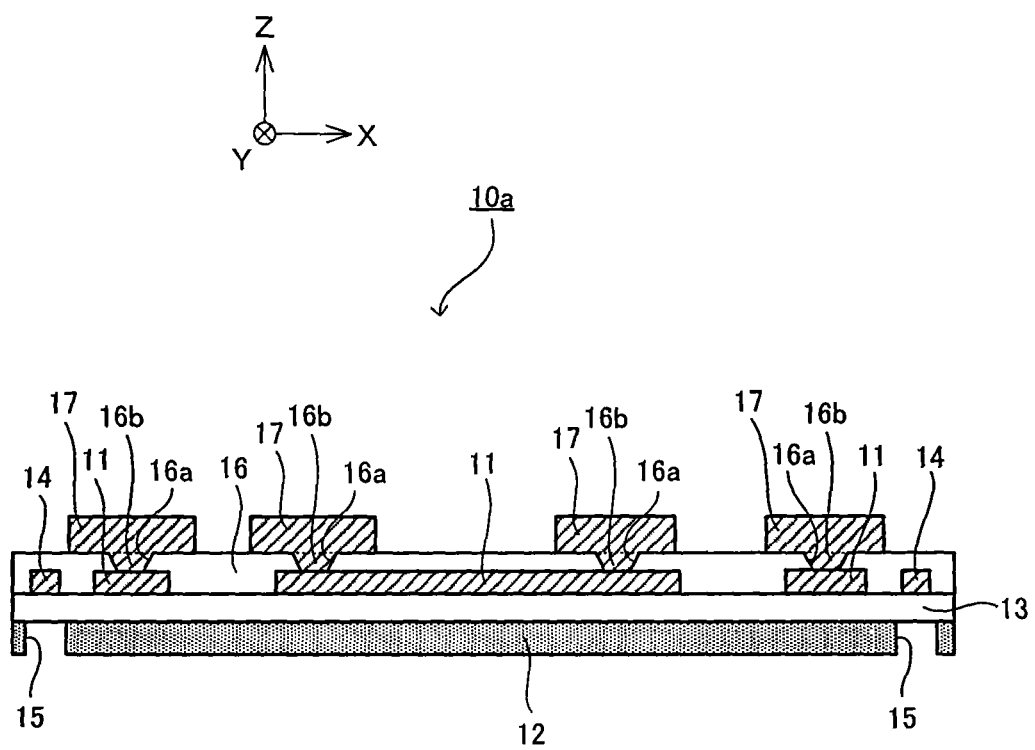
FIG. 2 is a cross-sectional view showing an electronic component according to an embodiment of the present invention.

Electronic component (10a) of the present embodiment prior to being mounted on multilayer printed wiring board 100 is described with reference to FIG. 2. FIG. 2 is a cross-sectional view cut through the (2-2) line in FIG. 3. As shown in FIG. 2, electronic component (10a) of the present embodiment has adhesive layer 12 with opening portion 15, insulation layer 13, alignment mark 14, wiring 11 with a finer wiring pitch than that of the wiring in multilayer printed wiring board 100 (hereinafter also simply referred to as "wiring with a finer wiring pitch"), insulation layer 16, via conductor (16b), and conductive pattern 17.

Wiring 11 with a finer wiring pitch and alignment mark 14 are formed on insulation layer 13 using the same material, for example, copper plating. Thus, to form wiring 11 with a finer wiring pitch and alignment mark 14, it is sufficient to form a layer made of the same material, for example, copper plating, on insulation layer 13 and to pattern the layer. Accordingly, manufacturing steps are simplified.

The planar shape (shape on the (X-Y) plane) of electronic component (10a) is substantially rectangular. Two alignment marks 14 are respectively positioned near opposing corners of electronic component (10a) (see FIG. 3).

Adhesive layer 12 is formed using an adhesive agent containing filler mixed in an adhesive resin material so as to reduce its coefficient of thermal expansion (CTE). As for the filler, inorganic fillers such as silica filler and alumina filler are thought to be preferable. However, that is not the only option, and organic filler may also be used instead of inorganic filler. Examples of adhesive resin material are epoxy resin, polyester resin, bismaleimide triazine resin (BT resin), polyimide resin, phenol resin and allyl polyphenylene ether resin (A-PPE resin) and the like.

Since irregular reflection occurs at the interface of the resin material and filler, adhesive layer 12 is optically opaque. Insulation layer 13 is an optically transparent layer. In adhesive layer 12, opening portion 15 is formed under alignment mark 14.

In electronic component (10a) of the present embodiment, wiring 11 is formed to have a finer wiring pitch than that of the wiring in multilayer printed wiring board 100. By mounting electronic component (10a) in insulation layer 131 of multilayer printed wiring board 100, part of the wiring is made finer, thus enabling an IC chip with lead terminals arrayed at fine intervals to be mounted accurately thereon, as described earlier.

As shown in FIG. 1, opening portion 15 has disappeared from electronic component 10 mounted inside insulation layer 131. Via conductor (147b) is connected to conductive pattern 17 formed on the first main-surface side of electronic component 10. Conductive pattern 133 is formed on the first main-surface side of via conductor (145b) and via conductor (147b). On the first main-surface side of insulation layer 131, solder-resist layer 135 with exposing portion (135a) to expose conductive pattern 133 is formed. The exposed portion of conductive pattern 133 becomes pad 137.

Figure 3:
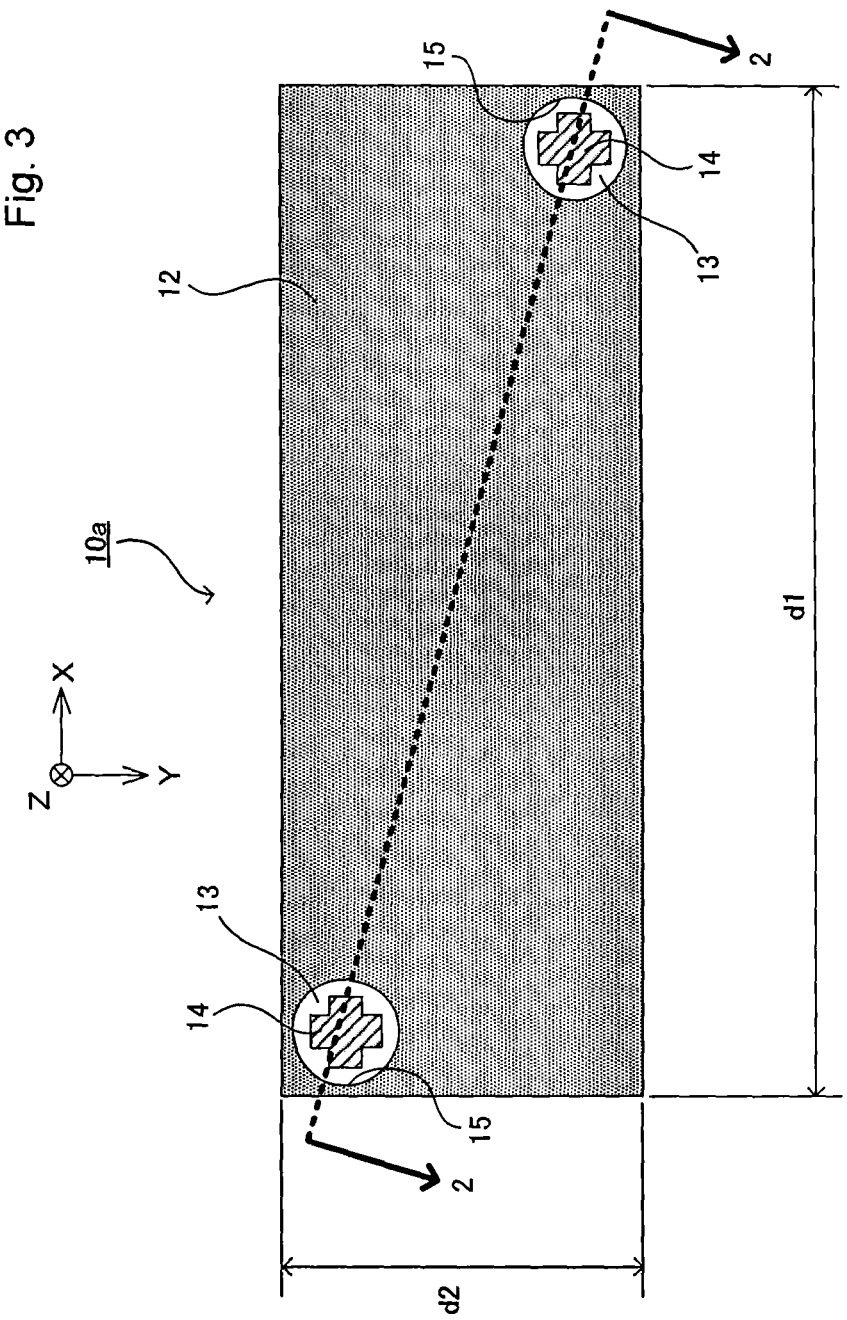
FIG. 3 is a bottom view showing the electronic component according to an embodiment of the present invention.

FIG. 3 shows a bottom view of electronic component (10a) of the present embodiment. In the present embodiment, the planar shape of electronic component (10a) is rectangular, for example, and length (d1) of the longer side is 4~50 mm, for example. Length (d2) of the shorter side is 1~20 mm, for example. The thickness of adhesive layer 12 is 3~20 μm, for example. The thickness of insulation layer 13 is 1~10 μm, for example.

As shown in FIG. 3, opening portion 15 of electronic component (10a) is formed in a position and a size so as to entirely show alignment mark 14 when seen from the bottom side. The size of alignment mark 14 is 150~500 μm, for example. Opening portion 15 is shaped substantially as a circle, and the diameter is 300~700 μm, for example.

Next, a method for manufacturing electronic component (10a) is described. In the present embodiment, electronic component (10a) is manufactured by a method shown in FIG. 4.

Figure 4:
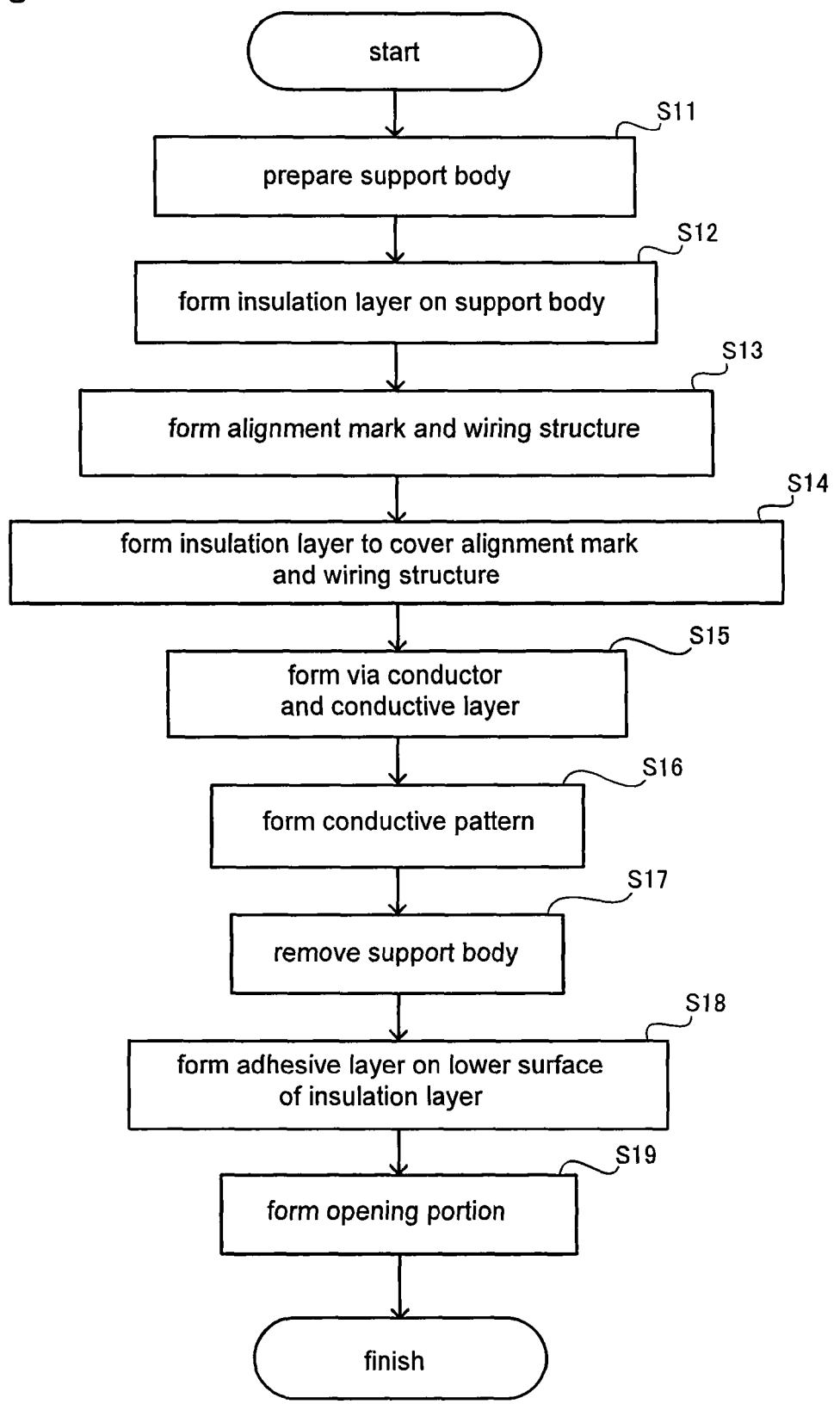
FIG. 4 is a flowchart showing a method for manufacturing the electronic component according to an embodiment of the present invention.
Figure 5:
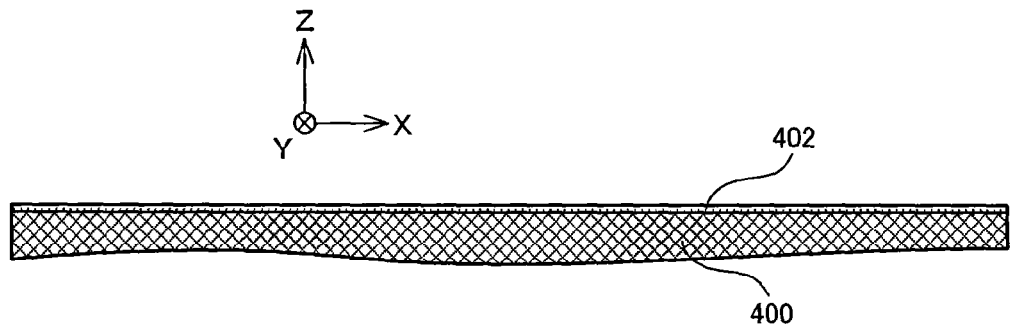
FIG. 5 is a view illustrating a step for preparing a support body.

In step (S11) of FIG. 4, support body 400 is prepared as shown in FIG. 5. Support body 400 is made of glass, for example. Then, adhesive support layer 402 is formed on support body 400.

In step (S12) of FIG. 4, insulation layer 13 is formed on support body 400 with support layer 402 disposed in between.

Figure 6:
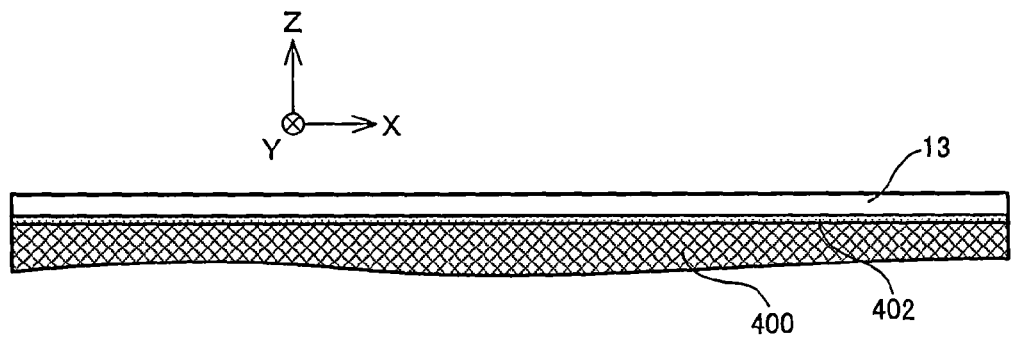
FIG. 6 is a view illustrating a step for forming an insulation layer.

More specifically, insulation layer 13 is positioned on the first main-surface side of support layer 402, as shown in FIG. 6. Insulation layer 13 and support layer 402 are adhered by applying heat, for example. Insulation layer 13 is optically transparent, and is made of a transparent resin, for example. As examples of the transparent resin, epoxy resin, phenol resin, polyol resin, polycarbonate resin and the like may be used.

In step (S13) of FIG. 4, wiring 11 with a finer wiring pitch and alignment mark 14 are formed on the first main-surface side of insulation layer 13.

Figure 7:
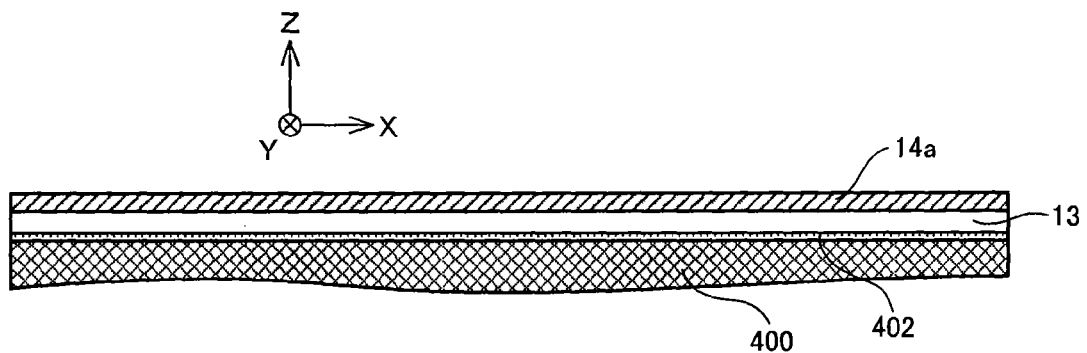
FIG. 7 is a view illustrating a step subsequent to the step in FIG. 6.
Figure 8:
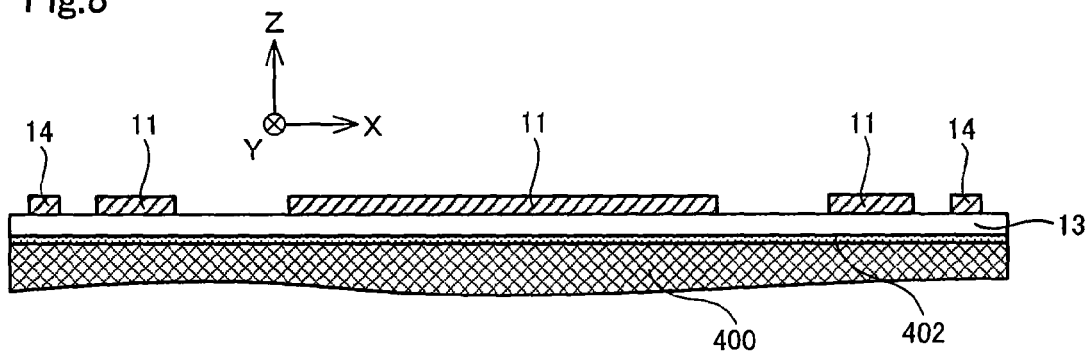
FIG. 8 is a view illustrating a step for forming an alignment mark.

More specifically, as shown in FIG. 7, conductive layer (14a) is formed on the first main-surface side of insulation layer 13 using a subtractive method, for example. However, forming conductive layer (14a) is not limited to a subtractive method, and a full-additive method or semi-additive method (SAP) may also be employed. Next, as shown in FIG. 8, conductive layer (14a) is patterned by a subtractive method, for example, forming alignment mark 14 and wiring 11 with a finer wiring pitch. Here, forming alignment mark 14 and wiring 11 with a finer wiring pitch is not limited to a subtractive method, and a full-additive method or semi-additive method may also be employed.

In step (S14) of FIG. 4, insulation layer 16 is formed.

Figure 9:
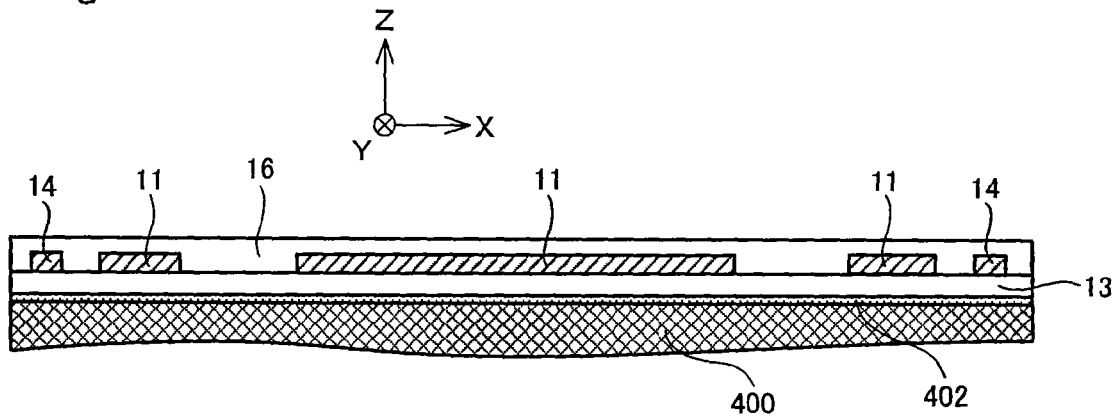
FIG. 9 is a view illustrating a step subsequent to the step in FIG. 8.

More specifically, as shown in FIG. 9, insulation layer 16 is laminated on insulation layer 13 to cover wiring 11 with a finer wiring pitch and alignment mark 14.

In step (S15) of FIG. 4, via conductor (16b) and a conductive layer are formed.

Figure 10:
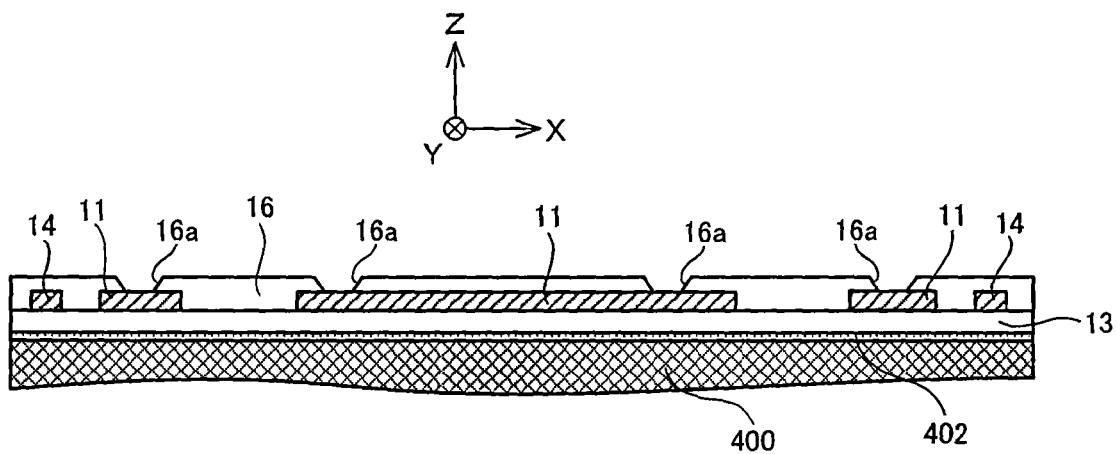
FIG. 10 is a view illustrating a step for forming a via hole.
Figure 11:
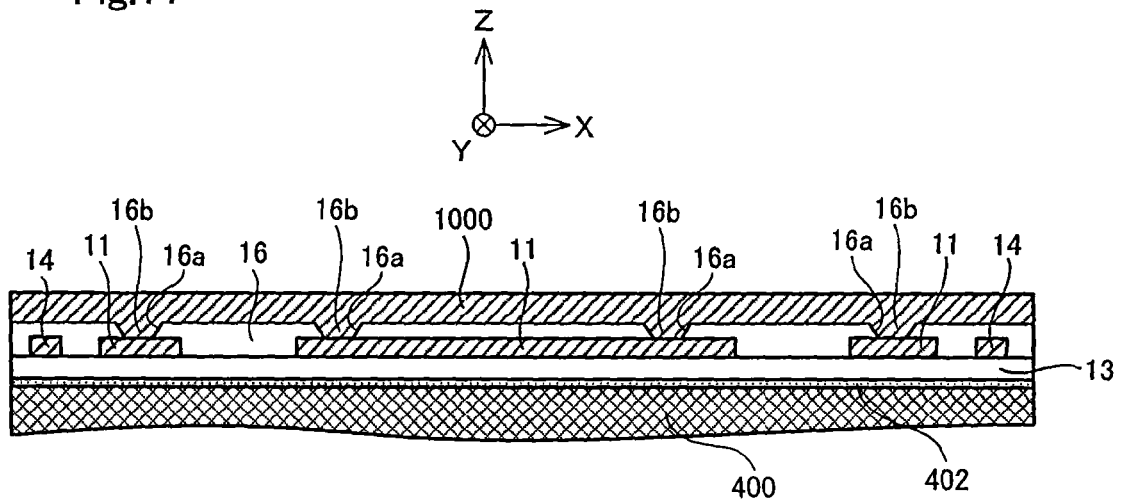
FIG. 11 is a view illustrating a step for forming a via conductor and a conductive layer.

More specifically, as shown in FIG. 10, hole (16a) (via hole) is formed in insulation layer 16 by irradiating laser light, for example. Hole (16a) reaches wiring 11 with a finer wiring pitch. Next, as shown in FIG. 11, electroless plating and electrolytic plating are performed using copper, for example, thereby filling hole (16a) to form via conductor (16b) while forming conductive layer 1000 on insulation layer 16.

In step (S16) of FIG. 4, conductive pattern 17 is formed.

Figure 12:
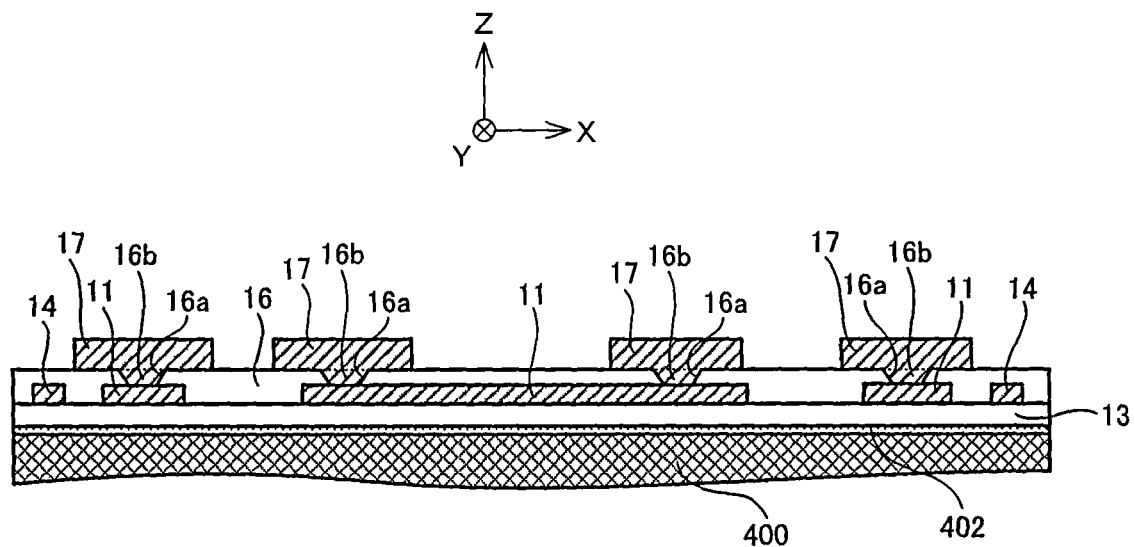
FIG. 12 is a view illustrating a step for forming a conductive pattern.

More specifically, as shown in FIG. 12, conductive layer 1000 is patterned by etching, for example, thereby forming conductive pattern 17.

In step (S17) of FIG. 4, support body 400 is removed.

Figure 13:
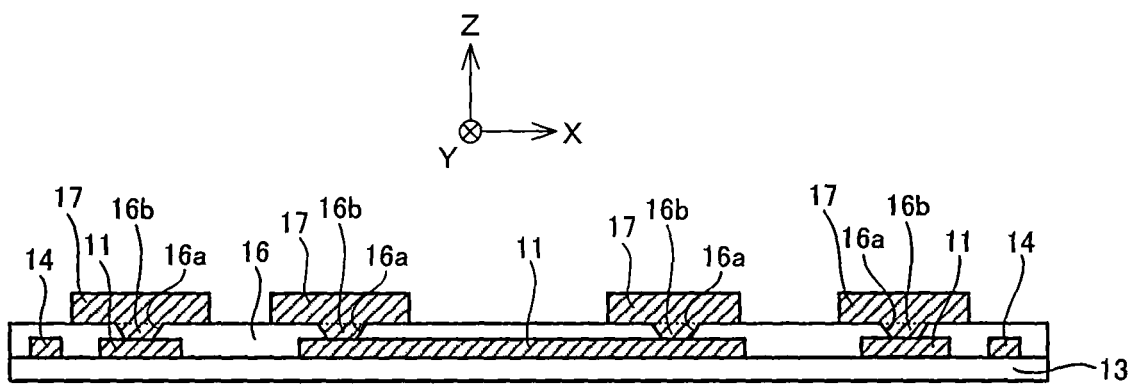
FIG. 13 is a view illustrating a step for removing the support body.

More specifically, support layer 402 is softened by applying heat, for example, and support body 400 is slid in a direction X (or a direction Y) so that support body 400 is removed from the second main surface of insulation layer 13. FIG. 13 shows the cross section after support body 400 has been removed. After support body 400 is removed from insulation layer 13, if part of support layer 402 remains on the second main surface of insulation layer 13, cleaning is conducted to remove the remaining portion of support layer 402. Support body 400 is recyclable.

In step (S18) of FIG. 4, adhesive layer 12 is formed.

Figure 14:
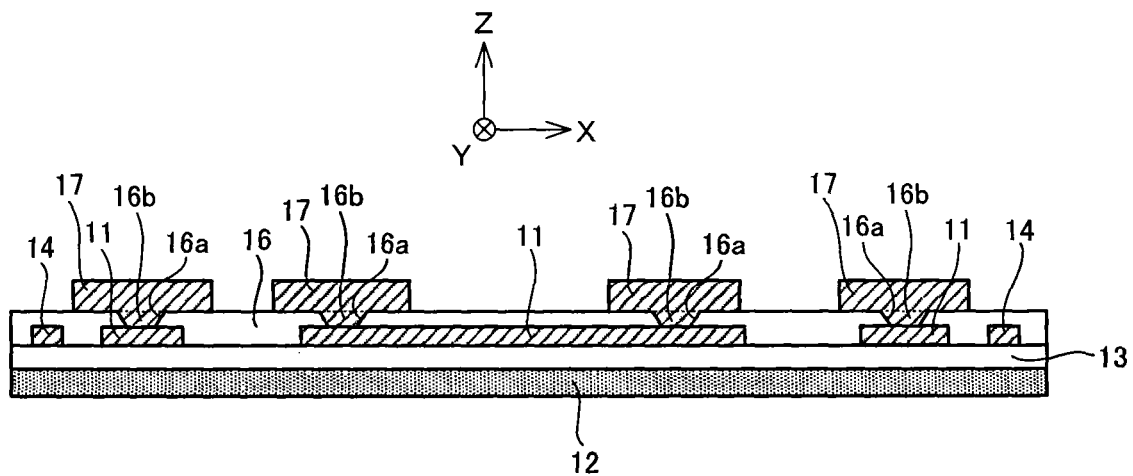
FIG. 14 is a view illustrating a step for forming an adhesive layer.

More specifically, as shown in FIG. 14, adhesive layer 12 is laminated on the second main-surface side (lower surface) of insulation layer 13 by coating an adhesive agent containing filler, for example. The adhesive agent for forming adhesive layer 12 is photosensitive. Accordingly, opening portion 15 is formed precisely at a predetermined portion in the next step for forming opening portion 15.

In step (S19) of FIG. 4, opening portion 15 is formed in adhesive layer 12.

Figure 15:
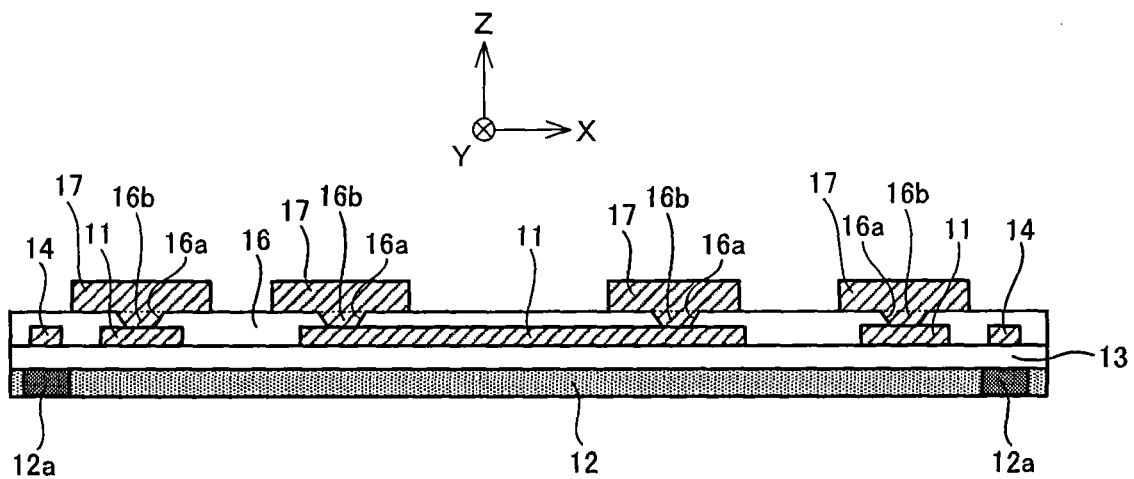
FIG. 15 is a view illustrating a step for forming an opening portion.

More specifically, as shown in FIG. 15, the adhesive agent at a portion of adhesive layer 12 located under alignment mark 14 is photosensitized and denatured by photolithography, for example. Then, using a removing solution, for example, the photosensitized and denatured portion (12a) is removed, thereby forming opening portion 15 (see FIG. 2).

As described so far, opening portion 15 of the present embodiment is formed by uniformly forming adhesive layer 12 first and by removing part of the adhesive agent. Therefore, opening portion 15 is accurately formed at a predetermined portion while adhesive layer 12 is formed to have a uniform thickness.

Accordingly, electronic component (10a) of the present embodiment is completed as shown in FIG. 2.

The manufacturing method of the present embodiment is suitable for manufacturing electronic component (10a). Using such a manufacturing method, an excellent electronic component (10a) is achieved, in which positional shifting is suppressed between alignment mark 14 and opening portion 15.

Next, a method for manufacturing multilayer printed wiring board 100 is described. In an embodiment here, multilayer printed wiring board 100 is manufactured by employing a method shown in FIG. 16.

Figure 16:
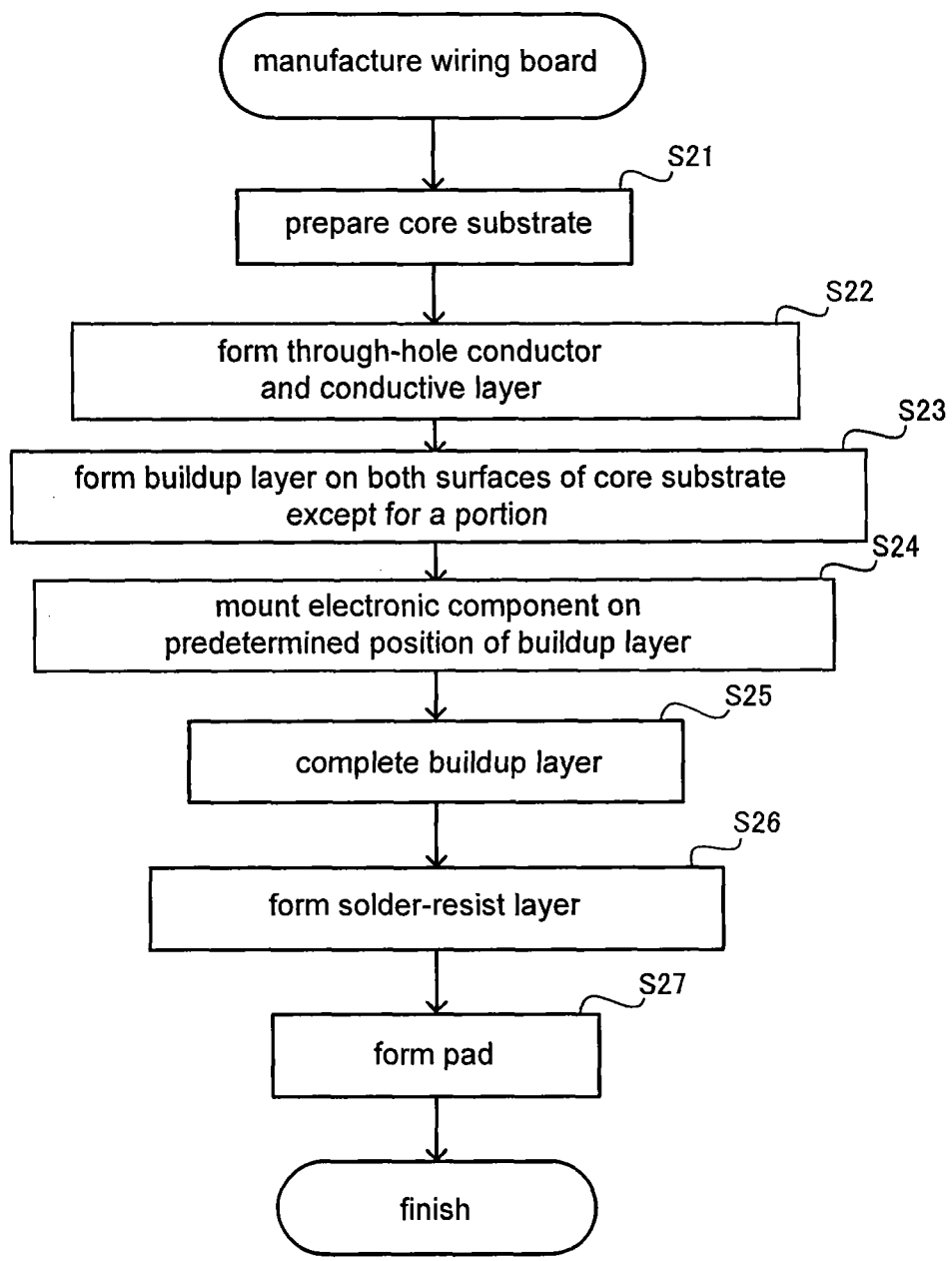
FIG. 16 is a flowchart showing a method for manufacturing a multilayer printed wiring board according to another embodiment of the present invention.
Figure 17:
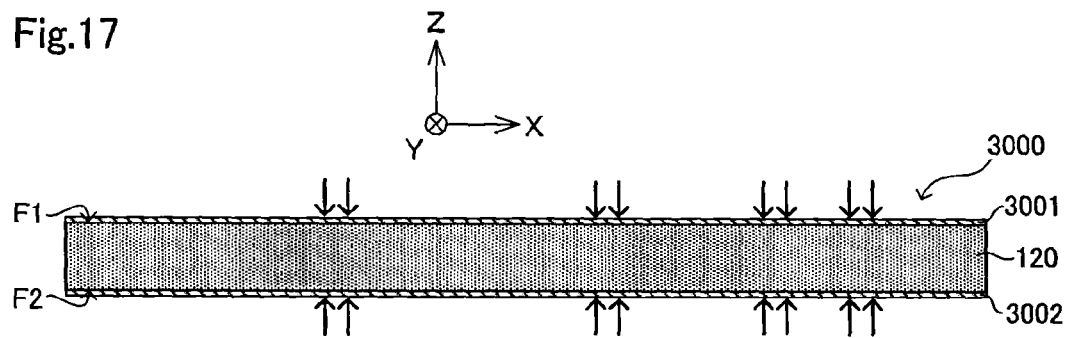
FIG. 17 is a view illustrating a step for preparing a core substrate.

In step (S21) of FIG. 16, core substrate 120 is prepared as shown in FIG. 17. Core substrate 120 is made of glass epoxy, for example. More specifically, double-sided copper foil laminate 3000 is prepared where a metal foil such as copper foil 3001 is laminated on first main surface (F1) of core substrate 120 and metal foil such as copper foil 3002 is laminated on second main surface (F2).

In step (S22) of FIG. 16, through-hole conductor (140b) and conductive layers are formed.

Figure 18:
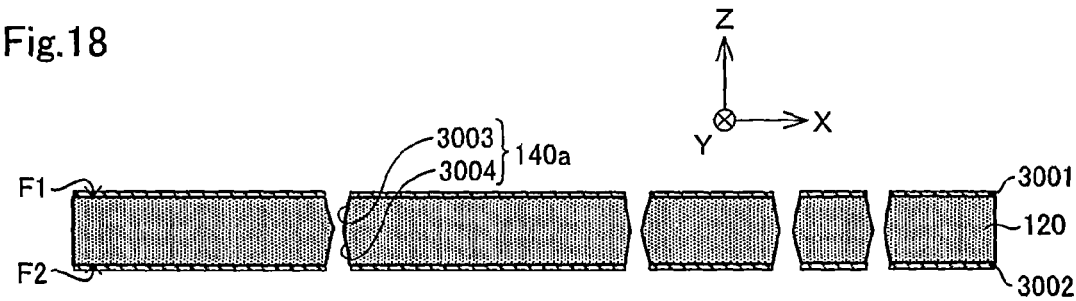
FIG. 18 is a view illustrating a step for forming a through hole.
Figure 19:
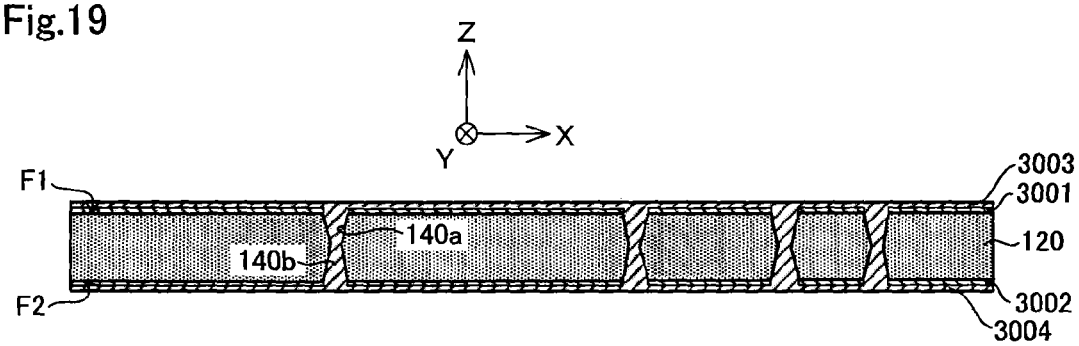
FIG. 19 is a view illustrating a step for forming a through-hole conductor.
Figure 20:
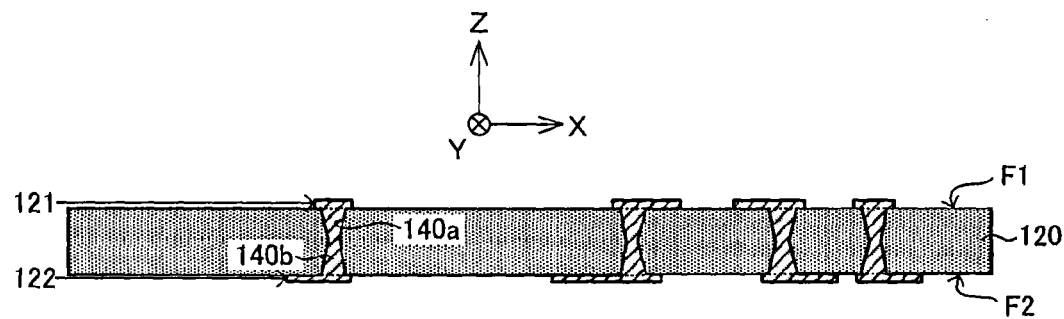
FIG. 20 is a view illustrating a step for forming a conductive pattern.

More specifically, as shown in FIG. 17, double-sided copper foil laminate 3000 is bored by irradiating laser light, for example, at both surfaces of double-sided copper foil laminate 3000. As shown in FIG. 18, hole 3003 and hole 3004 formed respectively from both sides are connected to be one hole, making hole (140a) (through hole). Next, as shown in FIG. 19, electroless plating and electrolytic platings (3003, 3004) are performed using copper, for example, in hole (140a) and on copper foils (3001, 3002) so that through-hole conductor (140b) and conductive layers are formed. Then, conductive layers are patterned by etching, for example. Accordingly, as shown in FIG. 20, conductive pattern 121 on first main surface (F1) and conductive pattern 122 on second main surface (F2) are formed respectively on core substrate 120.

In step (S23) of FIG. 16, buildup layers are respectively formed on both surfaces of core substrate 120.

Figure 21:
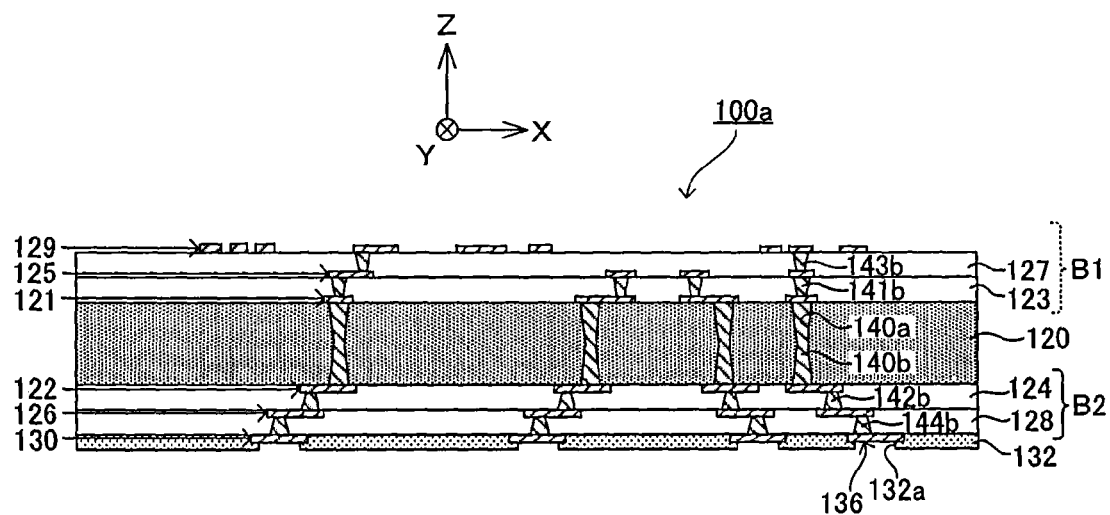
FIG. 21 is a view illustrating a step for forming a buildup layer.

More specifically, as shown in FIG. 21, using a full-additive method, semi-additive method (SAP), or a subtractive method, part of buildup layer (B1) (insulation layer 123, via conductor (141b), conductive pattern 125, insulation layer 127, via conductor (143b) and conductive pattern 129) are formed on the first main-surface side of core substrate 120. In the same manner, buildup layer (B2) and solder-resist layer 132 are formed on the second main-surface side of substrate 120. Accordingly, substrate (100a) for mounting electronic component (10a) above is formed.

In step (S24) of FIG. 16, electronic component (10a) is mounted on a predetermined position, which is part of buildup layer (B1) above.

Figure 22:
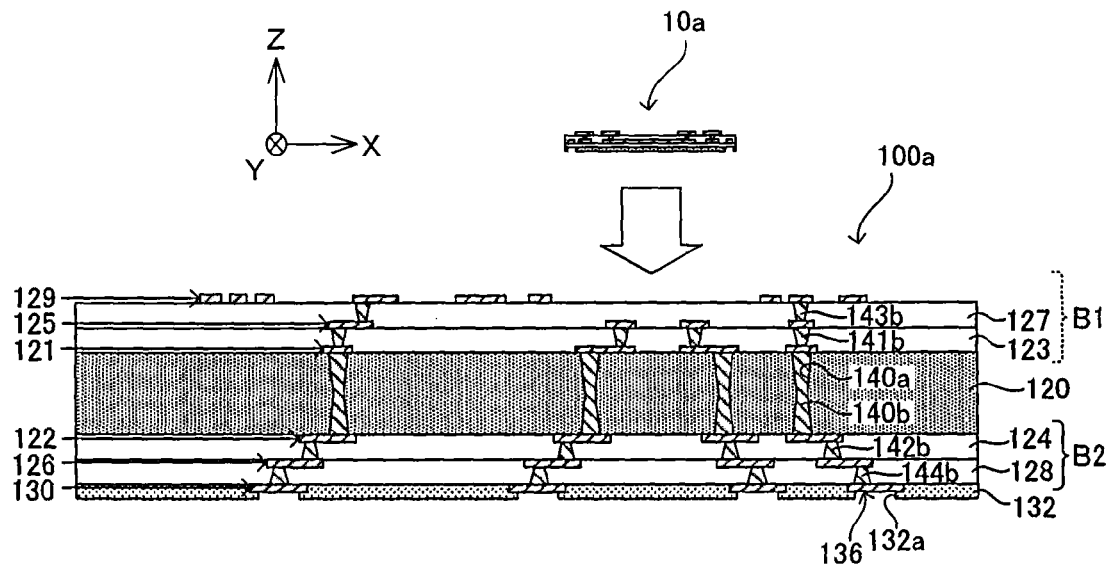
FIG. 22 is a view illustrating a step for mounting an electronic component on the substrate.

More specifically, as shown in FIG. 22, electronic component (10a) is adhered to insulation layer 127 of substrate (100a) by being aligned from the (+Z) direction.

Figure 23:
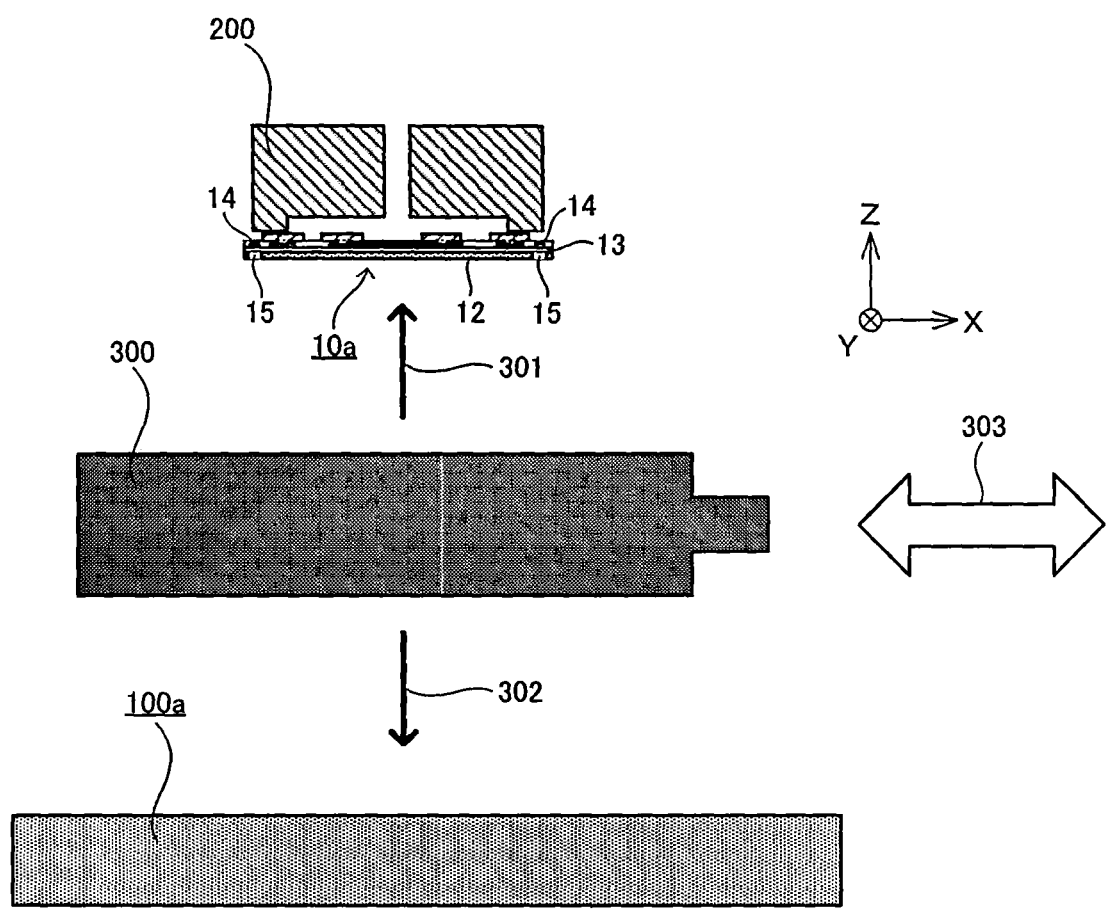
FIG. 23 shows schematic views of a method for aligning an electronic component with respect to the substrate.

The alignment of electronic component (10a) in the present embodiment is described with reference to FIG. 23. When alignment is conducted using a flip-chip bonder as shown in FIG. 23, camera unit 300 is located between electronic component (10a) adsorbed and held horizontally by vacuum adsorption device 200 and substrate (100a) positioned horizontally. Camera unit 300 is provided with CCD cameras on its first and second main surfaces. The CCD camera on the first main surface is capable of image recognition in arrow 301 direction (+Z direction). The CCD camera on the second main surface is capable of image recognition in arrow 302 direction (−Z direction). Camera unit 300 is movable along the (X-Y) plane as shown by arrows 303.

When camera unit 300 moves along the (X-Y) plane, the first main-surface side CCD camera recognizes alignment mark 14 and the second main-surface side CCD camera recognizes the alignment mark (omitted from the drawing) formed on the first main surface of substrate (100a). Accordingly, the relative position of electronic component (10a) in directions (X and Y) with respect to substrate (100a) is calculated. Based on the calculated result, vacuum adsorption device 200 moves along the (X-Y) plane so that electronic component (10a) is aligned at a predetermined position (coordinates (X, Y)) with respect to substrate (100a).

At that time, if opening portion 15 is not formed in electronic component (10a), the first main-surface side CCD camera of camera unit 300 captures the image of alignment mark 14 through optically opaque adhesive layer 12. As a result, alignment mark 14 may be blurred, resulting in recognition failure.

In electronic component (10a) of the present embodiment, opening portion 15 is formed under alignment mark 14. Thus, the first main-surface side CCD camera of camera unit 300 captures the image of alignment mark 14 only through optically transparent insulation layer 13. Therefore, alignment mark 14 is unlikely to be blurred, thereby enabling camera unit 300 to securely recognize alignment mark 14. Accordingly, electronic component (10a) is precisely aligned to a predetermined position with respect to substrate (100a).

Figure 24:
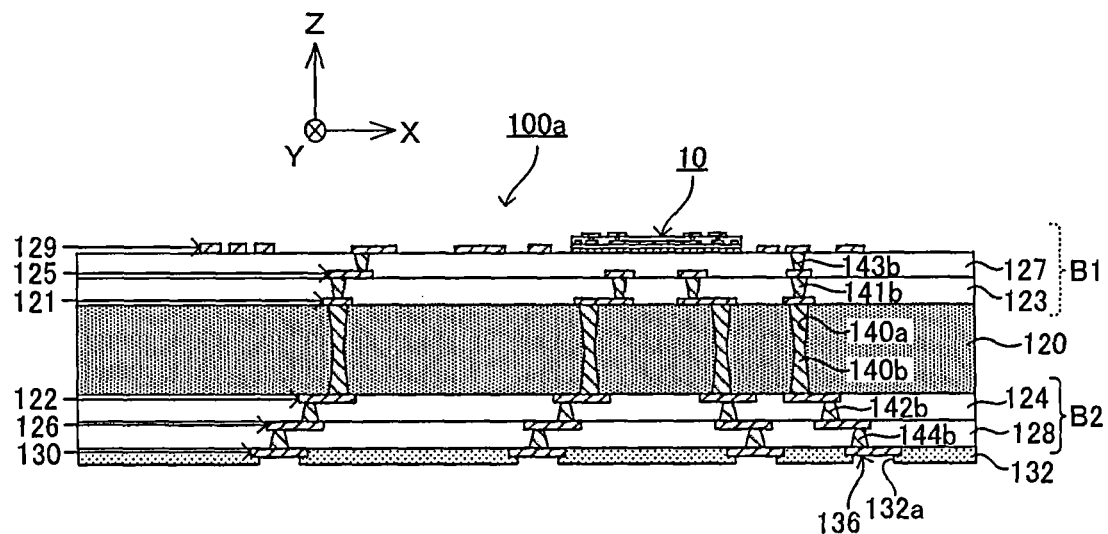
FIG. 24 is a view illustrating a state in which an electronic component is mounted on the substrate.

When the alignment is finished, camera unit 300 moves along the (X-Y) plane and retracts to the outside of electronic component (10a) and substrate (100a). Next, vacuum adsorption device 200 moves in direction (−Z) so that electronic component (10a) is pushed against substrate (100a). By so doing, adhesive layer 12 of electronic component (10a) is adhered to the first main surface of substrate (100a), and electronic component (10a) is mounted on substrate (100a). At that time, since the adhesive agent of adhesive layer 12 flows and fills opening 15, adhesive layer 12 is adhered to the entire surface of substrate (100a). Accordingly, electronic component 10 is mounted on a predetermined position of substrate (100a), as shown in FIG. 24.

In step (S25) of FIG. 16, buildup layer (B1) is completed.

Figure 25:
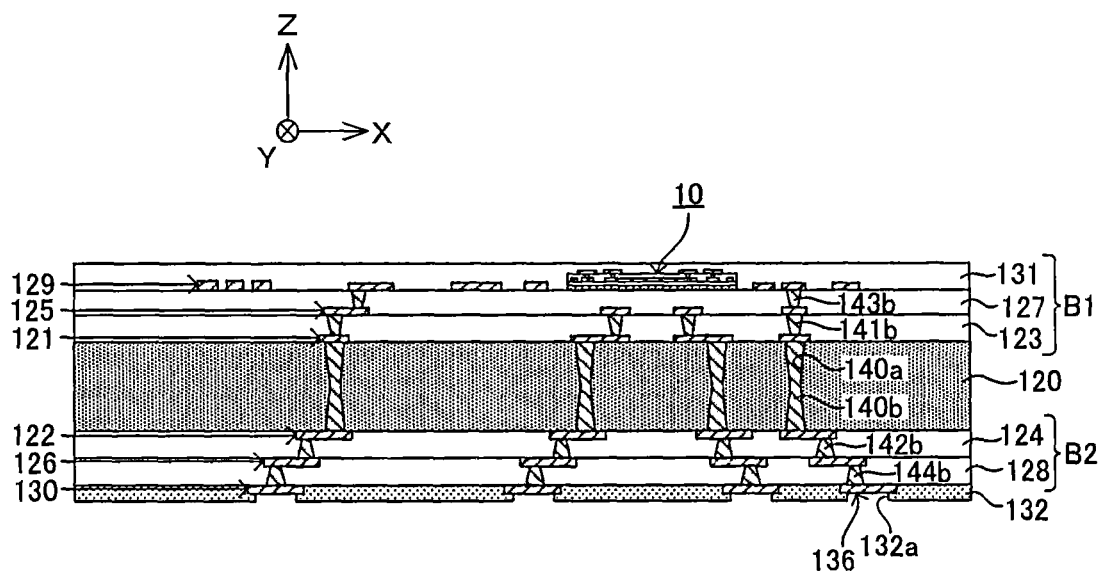
FIG. 25 is a view illustrating a step subsequent to the step in FIG. 22.

More specifically, as shown in FIG. 25, insulation layer 131 is formed to cover electronic component 10. Moreover, as shown in FIG. 1, via conductors (145b, 147b) each penetrating through insulation layer 131 are formed in insulation layer 131, and conductive pattern 133 is formed to be connected to via conductors (145b, 147b). Accordingly, buildup layer (B1) is completed.

As shown in FIGS. 1 and 25, in multilayer printed wiring board 100 of the present embodiment, the number of layers (three) of interlayer materials in buildup layer (B1) is different from the number of layers (two) of interlayer materials in buildup layer (B2). However, that is not the only option, and the number of layers of interlayer materials may be the same in buildup layers (B1, B2). From the viewpoint of suppressing warping of multilayer printed wiring board 100, the number of layers of interlayer materials is preferred to be the same in the upper and lower buildup layers.

In step (S26) of FIG. 16, solder-resist layer 135 is formed. More specifically, solder-resist layer 135 is formed to cover conductive pattern 133 as shown in FIG. 1.

In step (S27) of FIG. 16, pad 137 is formed.

More specifically, as shown in FIG. 1, exposing portion (135a) is formed in solder-resist layer 135 so as to expose conductive pattern 133. The exposed portion of conductive pattern 133 becomes pad 137.

As described above, multilayer printed wiring board 100 as shown in FIG. 1 is completed.

The manufacturing method of the present embodiment is suitable for manufacturing multilayer printed wiring board 100. Using such a manufacturing method, an excellent multilayer printed wiring board 100 with electronic component 10 mounted accurately at the predetermined position is achieved.

Next, a multilayer printed wiring board according to a first modified example of the present embodiment is described.

Figure 26:
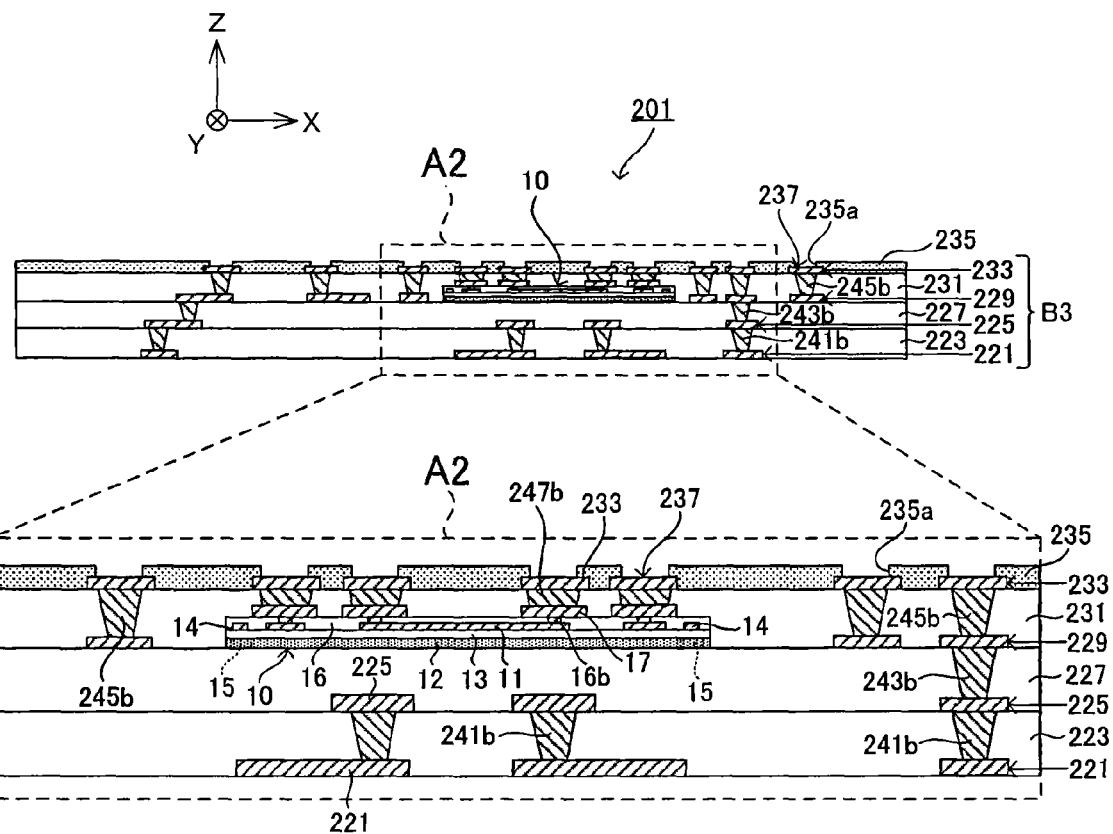
FIG. 26 shows a cross-sectional view of the entire structure of a multilayer printed wiring board according to a first modified example of an embodiment of the present invention and also shows an enlarged view of the main portion.

As an (X-Z) cross section in FIG. 26 shows, multilayer printed wiring board 201 according to the first modified example of the present embodiment has buildup layer (B3) and solder-resist layer 235. Multilayer printed wiring board 201 does not have a core substrate; namely, it is a coreless multilayer printed wiring board.

Buildup layer (B3) has pad 221, insulation layer 223, via conductor (241b), conductive pattern 225, insulation layer 227, via conductor (243b), conductive pattern 229, insulation layer 231, via conductor (245b) and conductive pattern 233. Electronic component 10 is mounted inside insulation layer 231.

Solder-resist layer 235 having exposing portion (235a) to expose conductive pattern 233 is formed on the first main-surface side of insulation layer 231. The exposed portion of conductive pattern 233 becomes pad 237. On the second main-surface side of insulation layer 223, pad 221 is exposed. It is an option to form a solder-resist layer having an exposing portion to expose part of pad 221 on the second main-surface side of insulation layer 223.

The lower part of FIG. 26 shows an enlarged view of main portion (A2) of multilayer printed wiring board 201 according to the first modified example of the present embodiment. Described in further detail, in multilayer printed wiring board 201, insulation layer 223 is formed to cover pad 221. Via conductor (241b) is formed in insulation layer 223 to penetrate through insulation layer 223. Conductive pattern 225 is formed on the first main-surface side of insulation layer 223. Conductive pattern 225 is connected to via conductor (241b). Insulation layer 227 is formed to cover conductive pattern 225. Via conductor (243b) is formed in insulation layer 227 to penetrate through insulation layer 227.

Conductive pattern 229 is formed on the first main-surface side of insulation layer 227. Conductive pattern 229 is connected to via conductor (243b). Electronic component 10 is mounted on the first main-surface side of insulation layer 227. Insulation layer 231 is formed to cover conductive pattern 229 and electronic component 10. Via conductor (245b) is formed in insulation layer 231 to penetrate through insulation layer 231.

As shown in FIG. 26, opening portion 15 in electronic component 10 mounted inside insulation layer 231 has disappeared. Via conductor (247b) is connected to conductive pattern 17 formed on the first main-surface side of electronic component 10. Conductive pattern 233 is formed on the first main-surface side of via conductors (245b, 247b)

above. Solder-resist layer 235 having exposing portion (235a) to expose conductive pattern 233 is formed on the first main-surface side of insulation layer 231.

A method for manufacturing multilayer printed wiring board 201 above is described. Multilayer printed wiring board 201 according to the first modified example of the present embodiment is manufactured by a method described below.

Figure 27:
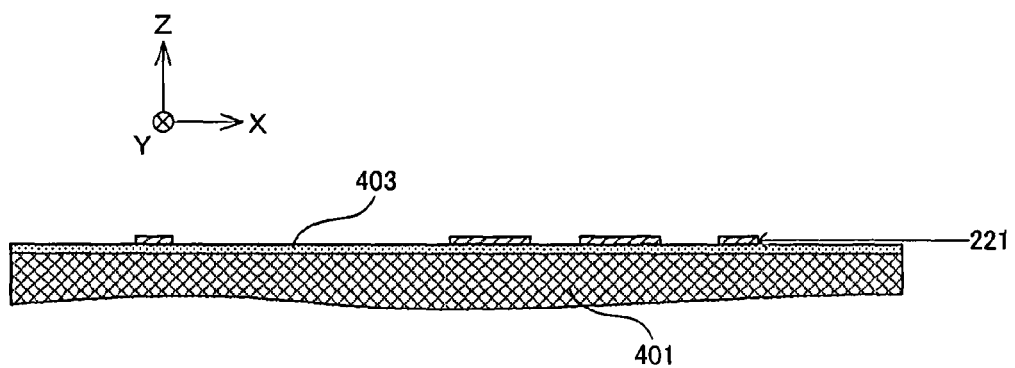
FIG. 27 is a view illustrating a method for manufacturing a multilayer printed wiring board according to the first modified example.

First, as shown in FIG. 27, support body 401 is prepared. Support body 401 is made of glass epoxy, for example. Then, copper foil 403 with an adhesive carrier is formed on support body 401. Next, on copper foil 403 with a carrier, pad 221 is formed using, for example, a full-additive or semi-additive (SAP) method.

Figure 28:
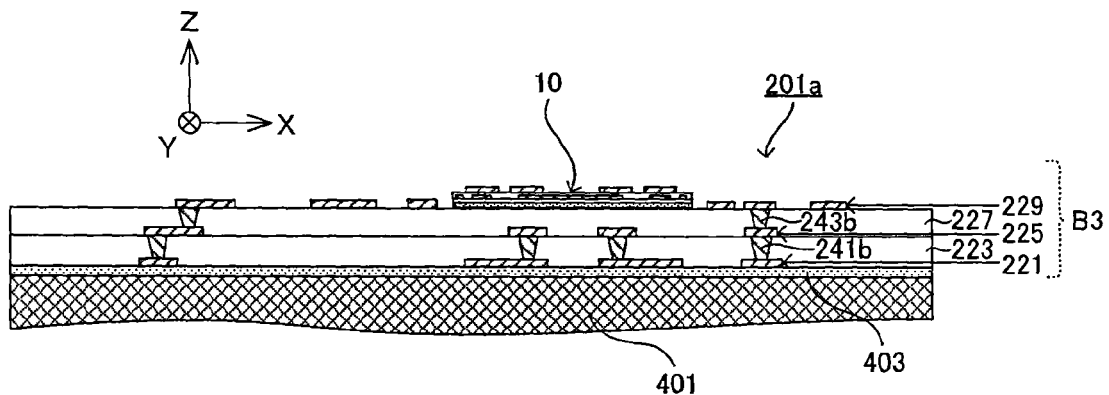
FIG. 28 is a view illustrating the method for manufacturing a multilayer printed wiring board according to the first modified example.

Next, as shown in FIG. 28, on pad 221, insulation layer 223, via conductor (241b), conductive pattern 225, insulation layer 227, via conductor (243b) and conductive pattern 229 are formed using a semi-additive method, for example. By doing so, substrate (201a) for mounting electronic component 10 above is formed. Then, electronic component 10 is mounted at a predetermined position on a portion of buildup layer (B3). More specifically, as shown in FIG. 28, electronic component 10 is aligned from the (+Z) direction and adhered onto insulation layer 227 of substrate (201a). Here, the alignment is conducted using a flip-chip bonder in the same manner employed as in multilayer printed wiring board 100 shown in FIG. 23.

Figure 29:
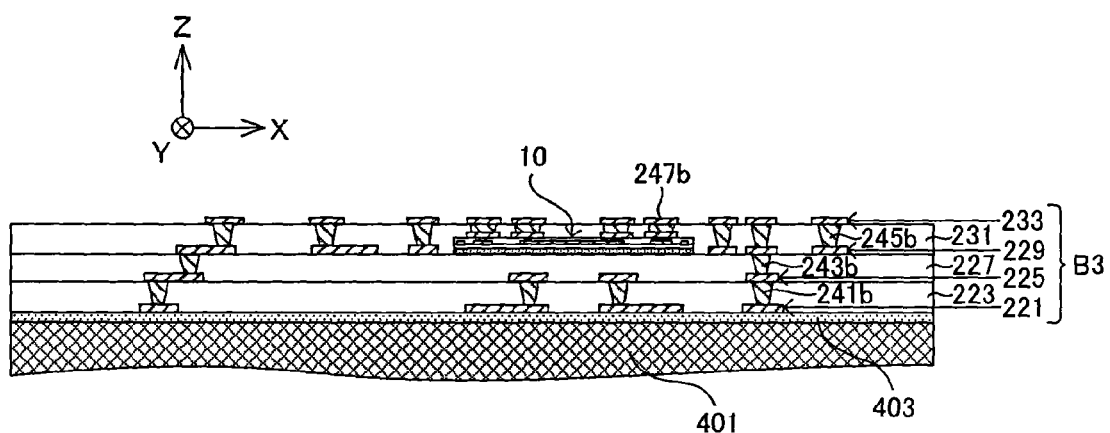
FIG. 29 is a view illustrating the method for manufacturing a multilayer printed wiring board according to the first modified example.
Figure 30:
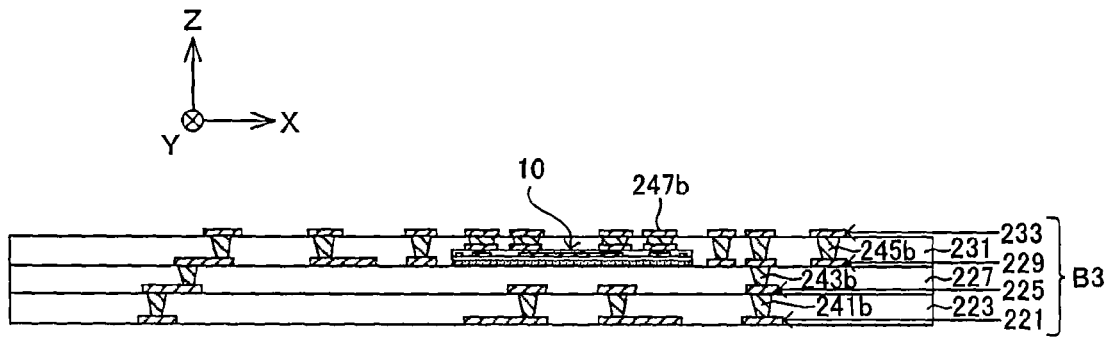
FIG. 30 is a view illustrating the method for manufacturing a multilayer printed wiring board according to the first modified example.

Next, as shown in FIG. 29, insulation layer 227 is formed to cover electronic component 10 and conductive pattern 229. Furthermore, via conductors (245b, 247b) and conductive pattern 233 are formed. Then, support body 401 and copper foil 403 with a carrier are removed. Accordingly, pad 221 is exposed on the second main-surface side of buildup layer (B3), as shown in FIG. 30.

Next, solder-resist layer 235 is formed. More specifically, as shown in FIG. 26, solder-resist layer 235 is formed to cover conductive pattern 233. Then, exposing portion (235a) is formed in solder-resist layer 235 to expose conductive pattern 233. Accordingly, the exposed portion of conductive pattern 233 becomes pad 237.

Accordingly, multilayer printed wiring board 201 shown in FIG. 26 is completed.

The manufacturing method according to the first modified example of the present embodiment is suitable for manufacturing multilayer printed wiring board 201. Using such a manufacturing method, excellent multilayer printed wiring board 201 (coreless multilayer printed wiring board) with electronic component 10 mounted accurately at a predetermined position is achieved.

Next, a multilayer printed wiring board according to a second modified example of the present embodiment is described. Multilayer printed wiring board 301 according to the second modified example of the present embodiment has core substrate 320, first buildup layer (B5), second buildup layer (B6), solder-resist layer 335 and solder-resist layer 332, as an (X-Z) cross section shows in FIG. 31. In multilayer printed wiring board 301, electronic component 10 is directly mounted on the first main-surface side of core substrate 320.

First buildup layer (B5) has conductive pattern 321, insulation layer 323, via conductor (341b), conductive pattern 325, insulation layer 327, via conductor (343b), conductive pattern 329, insulation layer 331, via conductor (345b) and conductive pattern 333.

Core substrate 320 is made of glass epoxy, for example. Hole (340a) (through hole) bored by laser light, for example, is formed in core substrate 320. Core substrate 320 has through-hole conductor (340b), made by filling hole (340a) with copper plating, for example. Through-hole conductor (340b) electrically connects first main-surface side conductive pattern 321 and second main-surface side conductive pattern 322.

Insulation layer 324 is formed to cover conductive pattern 322. Via conductor (342b) is formed in insulation layer 324 to penetrate through insulation layer 324. Conductive pattern 326 is formed on the second main-surface side of insulation layer 324. Conductive pattern 326 is connected to via conductor (342b). Insulation layer 328 is formed to cover conductive pattern 326. Via conductor (344b) is formed in insulation layer 328 to penetrate through insulation layer 328. Conductive pattern 330 is formed on the second main-surface side of insulation layer 328. Conductive pattern 330 is connected to via conductor (344b). Second buildup layer (B6) is made up of conductive pattern 322, insulation layer 324, via conductor (342b), conductive pattern 326, insulation layer 328, via conductor (344b) and conductive pattern 330.

On the second main-surface side of insulation layer 328, solder-resist layer 332 having exposing portion (332a) to expose conductive pattern 330 is formed. The exposed portion of conductive pattern 330 becomes pad 336.

Figure 31:
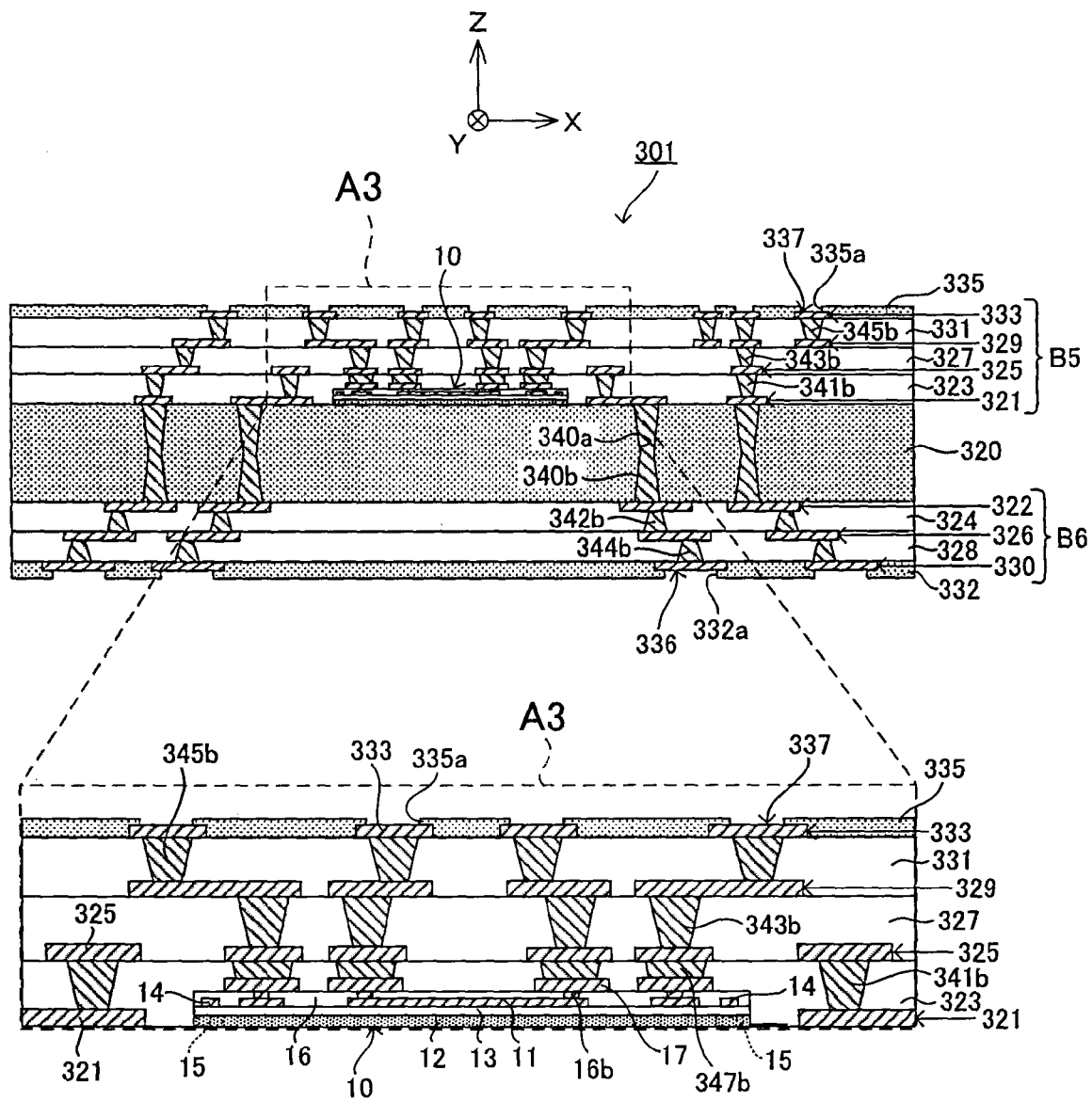
FIG. 31 shows a cross-sectional view of the entire structure of a multilayer printed wiring board according to a second modified example of an embodiment of the present invention and also shows an enlarged view of the main portion.

As shown in FIG. 31, in multilayer printed wiring board 301 according to the second modified example of the present embodiment, the number of layers (three) of interlayer materials in buildup layer (B5) is different from the number of layers (two) of interlayer materials in buildup layer (B6). However, that is not the only option, and the number of layers of interlayer materials may be the same in buildup layers (B5, B6). From the viewpoint of suppressing warping of multilayer printed wiring board 301, the number of layers of interlayer materials is preferred to be the same in the upper and lower buildup layers.

Main portion (A3) of multilayer printed wiring board 301 according to the second modified example of the present embodiment is enlarged and shown in the lower portion of FIG. 31. Described in further detail, in multilayer printed wiring board 301 according to the second modified example of the present embodiment, conductive pattern 321 is formed on the first main-surface side of core substrate 320. Also, electronic component 10 is mounted on the first main-surface side of core substrate 320. Insulation layer 323 is formed to cover conductive pattern 321 and electronic component 10. Via conductor (341b) is formed in insulation layer 323 to penetrate through insulation layer 323. Also, via conductor (347b) is formed in insulation layer 323 to penetrate through insulation layer 323 and be connected to conductive pattern 17 of electronic component 10. Conductive pattern 325 is formed on the first main-surface side of insulation layer 323. Conductive pattern 325 is connected to via conductors (341b, 347b). Insulation layer 327 is formed to cover conductive pattern 325. Via conductor (343b) is formed in insulation layer 327 to penetrate through insulation layer 327.

Conductive pattern 329 is formed on the first main-surface side of insulation layer 327. Conductive pattern 329 is connected to via conductor (343b). Insulation layer 331 is formed to cover conductive pattern 329. Via conductor (345b) is formed in insulation layer 331 to penetrate through insulation layer 331.

Figure 32:
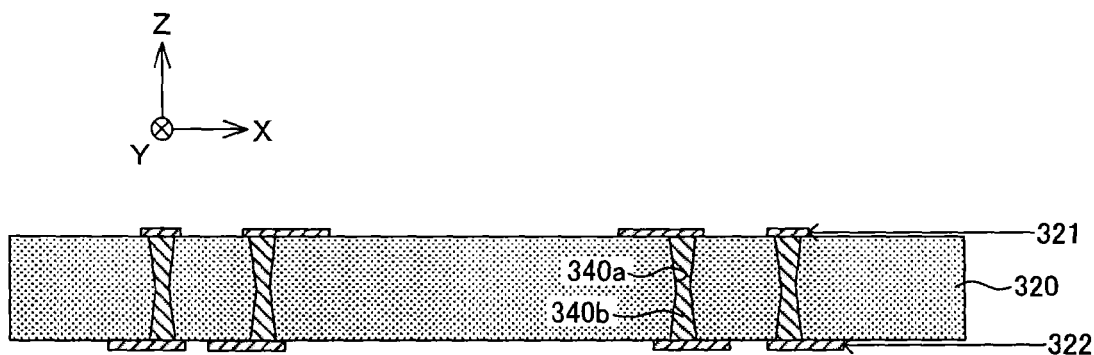
FIG. 32 is a view illustrating a method for manufacturing a multilayer printed wiring board according to the second modified example.

To manufacture multilayer printed wiring board 301 according to the second modified example of the present embodiment, first, hole (340a) (through hole) bored by laser light, for example, is formed in core substrate 320, as shown in FIG. 32. Next, hole (340a) is filled with copper plating, for example, so as to form through-hole conductor (340b). Then, conductive pattern 321 is formed on the first main-surface side of core substrate 320, and conductive pattern 322 is formed on the second main-surface side of core substrate 320.

Figure 33:
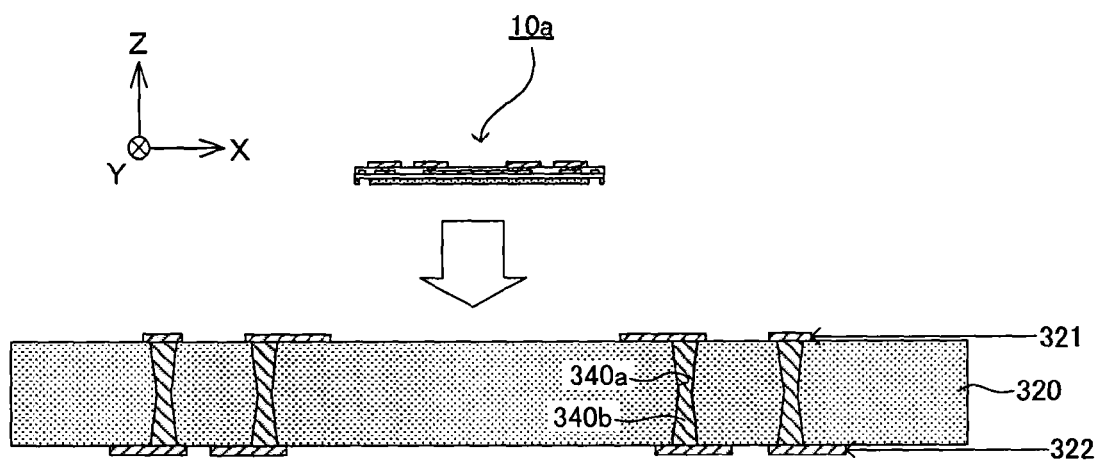
FIG. 33 shows views illustrating the method for manufacturing a multilayer printed wiring board according to the second modified example.

Next, as shown in FIG. 33, electronic component (10a) (electronic component prior to being adhered) is mounted on a predetermined position of core substrate 320. More specifically, as shown in FIG. 33, electronic component (10a) is aligned from the (+Z) direction and adhered to the first main-surface side of core substrate 320. Such alignment is conducted using a flip-chip bonder in the same manner as that for multilayer printed wiring board 100 described above with reference to FIG. 23.

Figure 34:
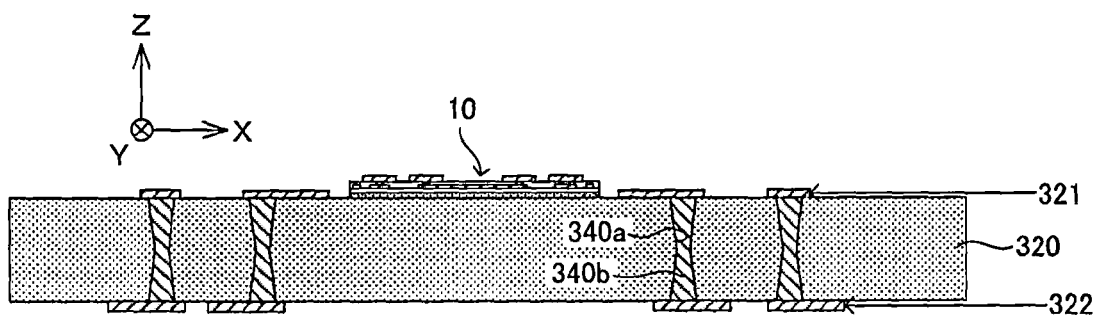
FIG. 34 is a view illustrating the method for manufacturing a multilayer printed wiring board according to the second modified example.

FIG. 34 shows a state in which electronic component 10 is adhered to core substrate 320. The rest is conducted the same as in the method for manufacturing multilayer printed wiring board 100 described above, and first buildup layer (B5) and second buildup layer (B6) are formed. Accordingly, multilayer printed wiring board 301 is manufactured.

To describe multilayer printed wiring board 301 according to the second modified example of the present embodiment, first buildup layer (B5) having three insulation layers is formed on the first main-surface side of core substrate 320, and second buildup layer (B6) having two insulation layers is formed on the second main-surface side. However, that is not the only option, and core substrate 320 with mounted electronic component 10 as shown in FIG. 34 may be used to form various lamination structures.

As shown in FIG. 3, the adhesive agent of adhesive layer 12 is present on the entire circumference of opening portion 15 in electronic component (10a) of the embodiment. Thus, the air in opening portion 15 cannot escape during the above adhesion process, and may cause a void to be formed in adhesive layer 12. Electronic components according to modified examples of the present embodiment are described with reference to FIGS. 35 and 36.

Figure 35:
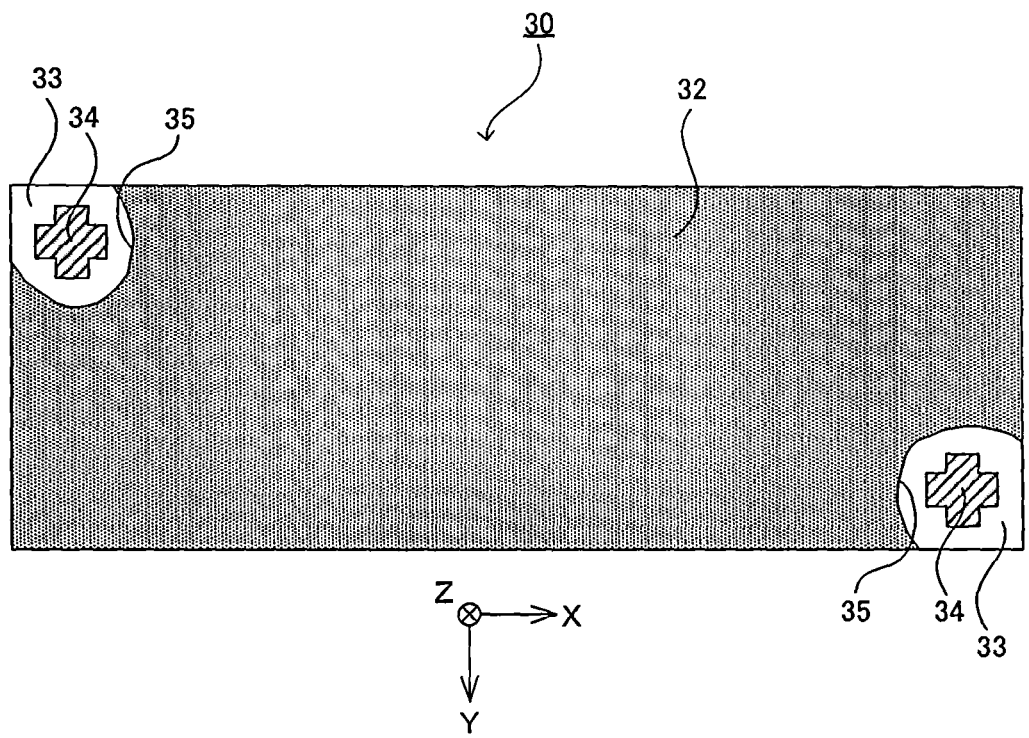
FIG. 35 is a bottom view showing the electronic component according to the first modified example of an embodiment of the present invention.

As shown in FIG. 35, electronic component 30 according to a first modified example of the embodiment has adhesive layer 32 with opening portion 35, insulation layer 33 and alignment mark 34, the same as in electronic component (10a) described above. The difference in electronic component 30 from electronic component (10a) is the shape of opening portion 35. Opening portions 35 are respectively formed near the opposing corners of electronic component 30. Here, opening portion 35 reaches the outer edge of insulation layer 33.

Namely, along the outer edge of insulation layer 33, no adhesive agent is present at a corner of opening portion 35. Thus, when electronic component 30 is adhered to the substrate, the adhesive agent flows toward the corner of opening portion 35 while the air in opening portion 35 escapes through the corner of opening portion 35. Therefore, the air in opening portion 35 is less likely to remain in adhesive layer 32. Accordingly, a void is prevented from being formed in adhesive layer 32.

Figure 36:
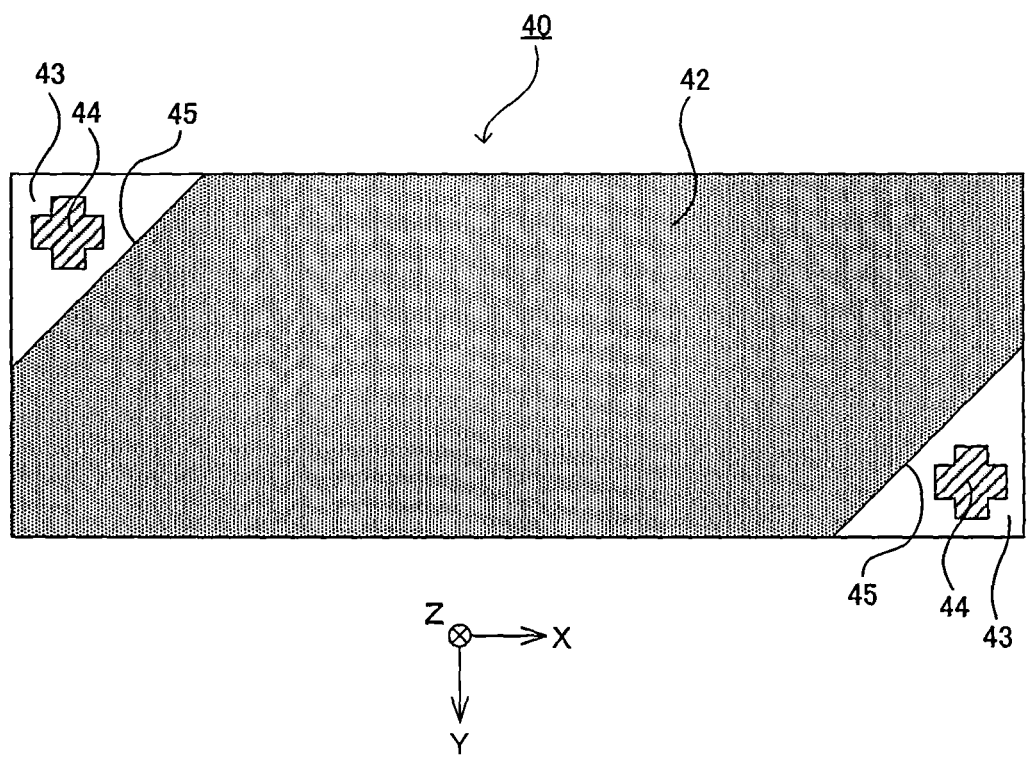
FIG. 36 is a bottom view showing the electronic component according to the second modified example of an embodiment of the present invention.

As shown in FIG. 36, electronic component 40 according to a second modified example of the present embodiment has adhesive layer 42 with opening portion 45, insulation layer 43 and alignment mark 44, the same as in electronic components (10a, 30) described above. The difference in electronic component 40 from electronic components (10a, 30) is the shape of opening portion 45. Opening portions 45 are respectively formed by cutting off the opposing corners of adhesive layer 42. Namely, opening portion 45 reaches the outer edge of insulation layer 43.

As described above, along the outer edge of insulation layer 43, no adhesive agent is present at a corner of opening portion 45. Thus, when electronic component 40 is adhered to the substrate, the adhesive agent flows toward the corner of opening portion 45 while the air in opening portion 45 escapes through the corner of opening portion 45. Therefore, the air in opening portion 45 is less likely to remain in adhesive layer 42. Accordingly, a void is prevented from being formed in adhesive layer 42.

So far, descriptions are provided for electronic components, methods for manufacturing such electronic components, and methods for manufacturing multilayer printed wiring boards according to embodiments of the present invention. However, the present invention is not limited to those embodiments.

The planar shape of the electronic components is not limited to a rectangle, but any planar shape may be employed depending on usage purposes. In the above manufacturing methods, adhesive layer 12 was uniformly formed and part of the adhesive layer was later removed so that opening portion 15 was formed. However, that is not the only option, and opening portion 15 may be formed at the same time that adhesive layer 12 is formed on the second main-surface side of insulation layer 13.

When the above manufacturing methods were described, the adhesive agent was removed by a method using photolithography. However, that is not the only option, and other methods such as mechanical methods may be used to remove the adhesive agent. Regarding photolithography, an example was described in which the photosensitive portion was denatured and removed. However, it is another option for the photosensitive portion to be cured and for the non-photosensitive portion to be removed by a removing solution.

Regarding other features, the structures of electronic components (10a, 30, 40) and multilayer printed wiring boards (100, 201), types of their structural elements, properties, measurements, materials, shapes, number of layers, positions and the like may be modified freely within a scope that does not deviate from the gist of the present invention.

As the material for insulation layers, any material may be used as long as it is optically transparent at least before a thermosetting treatment. For example, as resins for forming insulation layers, thermosetting resins or thermoplastic resins may be used. In addition to epoxy resins and polyimides, examples of thermosetting resins to be used are BT resin, allyl polyphenylene ether resin (A-PPE resin), aramid resin and the like. Also, examples of thermoplastic resins to be used are polycarbonate resin, liquid-crystal polymer (LCP), PEEK resin and the like. Those materials are preferred to be selected as needed from the viewpoints of transparency, insulation, dielectric properties, heat resistance, mechanical characteristics, and the like. Alignment marks, conductive patterns, insulation layers and adhesive layers may be formed with multiple layers each made of different materials.

The steps for manufacturing an electronic component are not limited to the order and contents shown in the flowchart of FIG. 4; the order and contents may be modified freely within a scope that does not deviate from the gist of the present invention. Also, any unnecessary step may be omitted depending on usage purposes or the like.

The steps for manufacturing a multilayer printed wiring board are not limited to the order and contents shown in the flowchart of FIG. 16; the order and contents may be modified freely within a scope that does not deviate from the gist of the present invention. Also, any unnecessary step may be omitted depending on usage purposes.

When the number of lead terminals in an IC chip mounted on a multilayer printed wiring board increases, the distance between lead terminals decreases. Then, pads to be connected to the lead terminals of an IC chip are formed at fine positional intervals on a surface of a multilayer printed wiring board.

Figure 37:
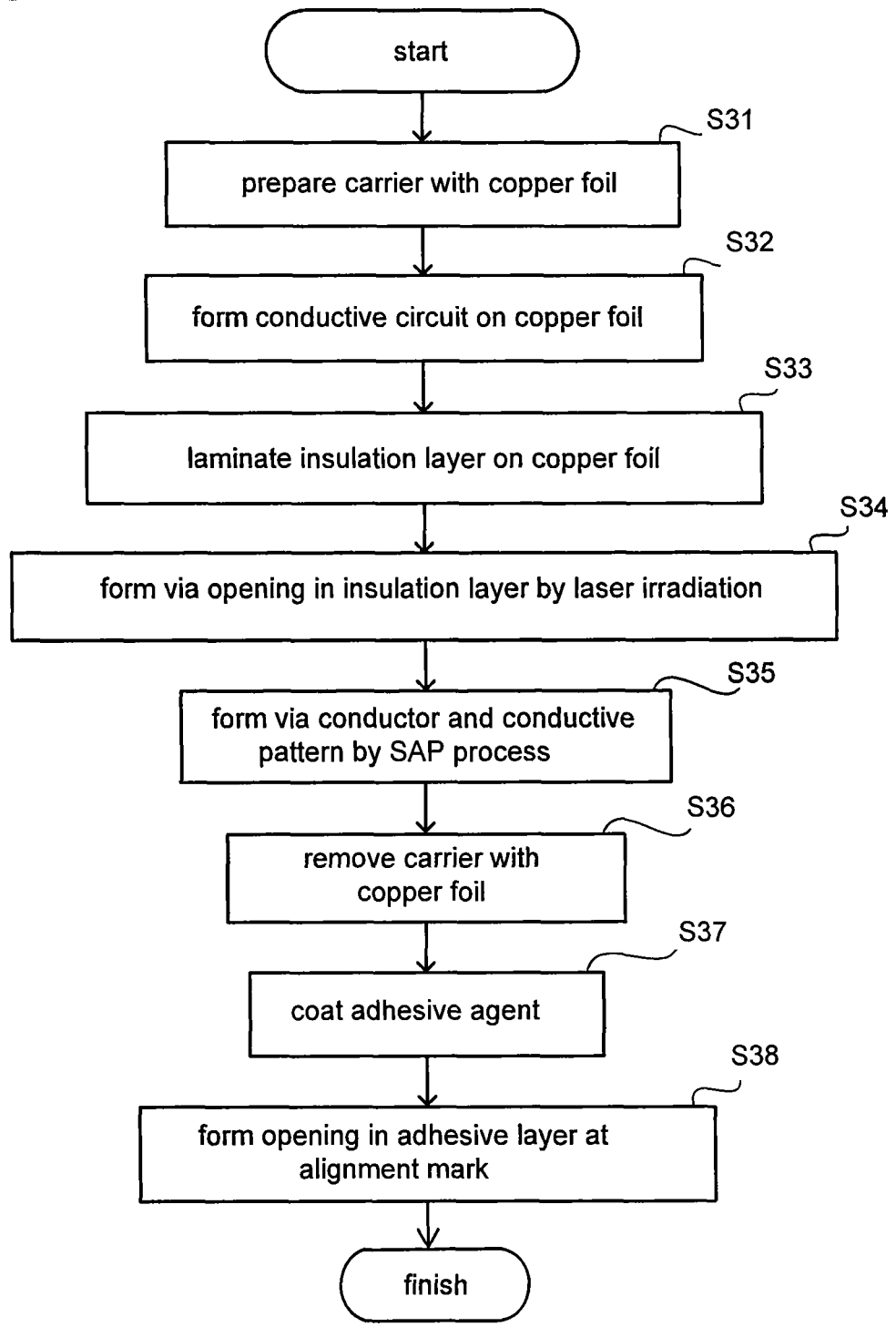
FIG. 37 is a flowchart showing another method for manufacturing the electronic component according to an embodiment of the present invention.
Figure 38:
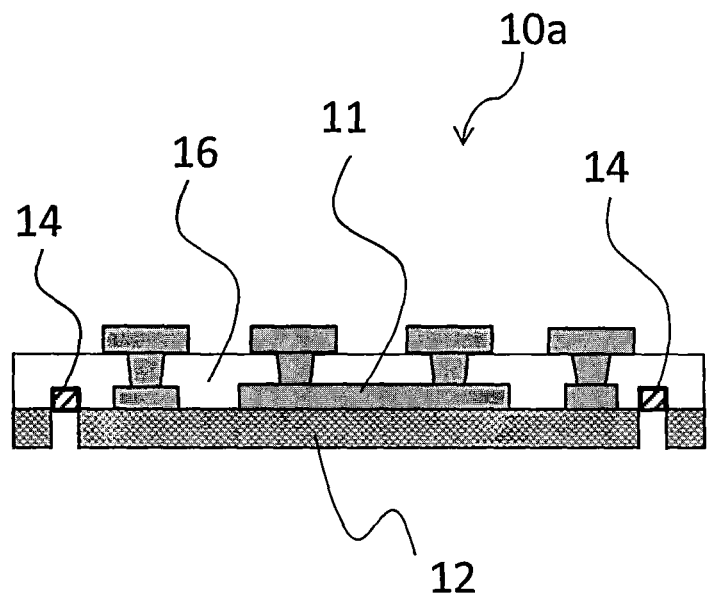
FIG. 38 is a cross-sectional view showing an electronic component according to an embodiment of the present invention.

Next, another method for manufacturing electronic component (10a) as shown in FIG. 38 is described. In the present embodiment, electronic component (10a) is manufactured by a method shown in FIG. 37.

Figure 39:
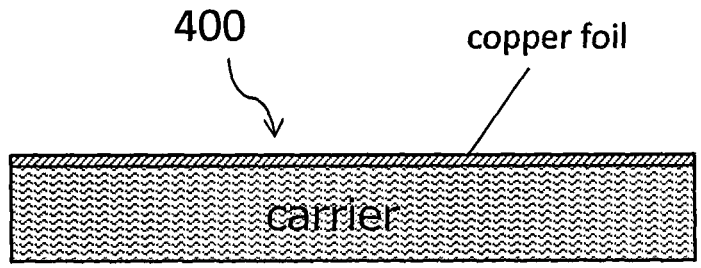
FIG. 39 is a view illustrating a step for preparing a support body.

In step (S31) of FIG. 37, support body 400 is prepared as shown in FIG. 39. Support body 400 is formed of a carrier and a copper foil formed on the carrier, for example.

Figure 40:
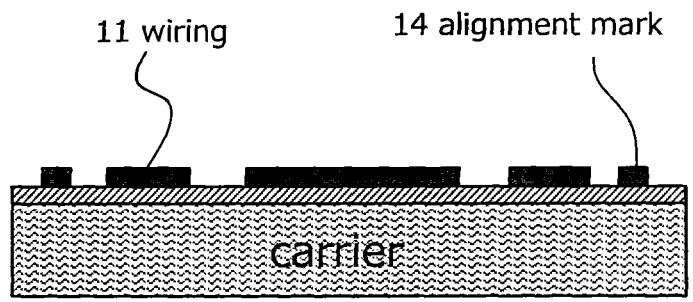
FIG. 40 is a view illustrating a step for forming a conductive circuit.

In step (S32) of FIG. 37, wiring 11 with a finer wiring pitch and alignment mark 14 are formed on the copper foil of support body 400 as shown in FIG. 40.

Figure 41:
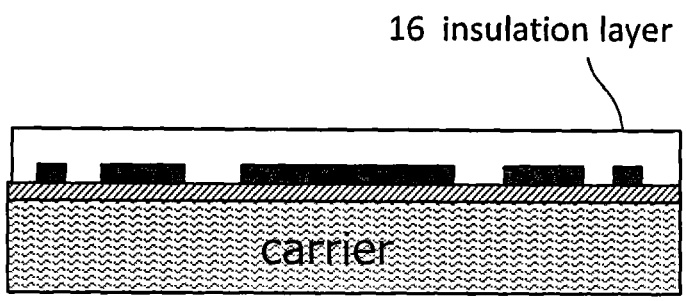
FIG. 41 is a view illustrating a step for forming an insulation layer.

In step (S33) of FIG. 37, insulation layer 16 is formed on support body 400 and covers wiring 11 with a finer wiring pitch and alignment mark 14 formed on the copper foil of support body 400 as shown in FIG. 41. Insulation layer 16 may be optically transparent or optically non-transparent, and may be made of a transparent or non-transparent resin, for example. As examples of the resin, epoxy resin, phenol resin, polyol resin, polycarbonate resin and the like may be used.

Figure 42:
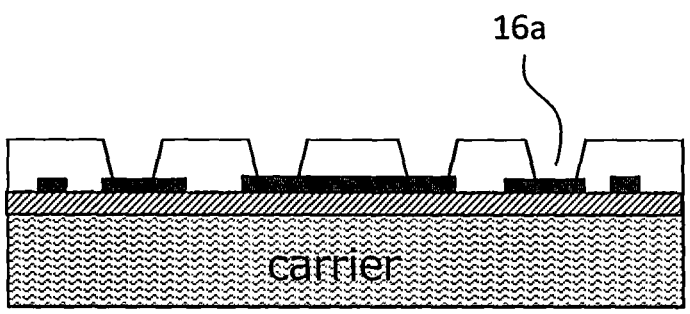
FIG. 42 is a view illustrating a step for forming a via hole.

In step (S34) of FIG. 37, as shown in FIG. 42, hole (16a) (via hole) is formed in insulation layer 16 by irradiating laser light, for example. Hole (16a) reaches wiring 11 with a finer wiring pitch.

Figure 43:
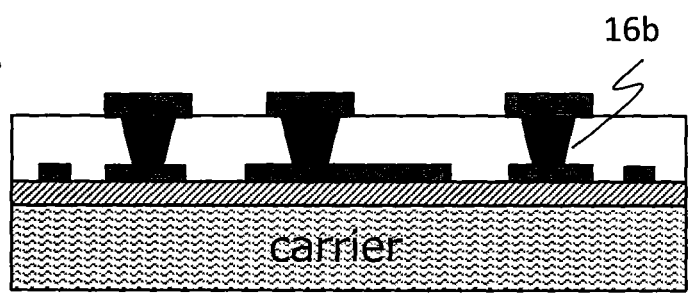
FIG. 43 is a view illustrating a step forming a via conductor and a conductive pattern.

Next, in step (S35) of FIG. 37, via conductor (16b) and a conductive layer are formed as shown in FIG. 43. Electroless plating and electrolytic plating are performed using copper, for example, thereby filling hole (16a) to form via conductor (16b) while forming conductive layer on insulation layer 16.

Figure 44:
FIG. 44 is a view illustrating a step for removing a support body.

In step (S36) of FIG. 37, support body 400 is removed. More specifically, support body 400 is removed from insulation layer 16. FIG. 44 shows the cross section of insulation layer 16 having wiring 11 and alignment mark 14 after support body 400 has been removed. Support body 400 may be recyclable.

Figure 45:
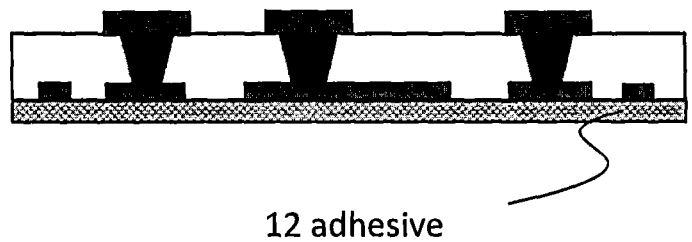
FIG. 45 is a view illustrating a step for forming an adhesive layer.

In step (S37) of FIG. 37, adhesive layer 12 is formed. More specifically, as shown in FIG. 45, adhesive layer 12 is laminated on the first main-surface side (lower surface) of insulation layer 16 by coating an adhesive agent containing filler, for example. The adhesive agent for forming adhesive layer 12 is photosensitive. Accordingly, opening portion 15 is formed precisely at a predetermined portion in the next step for forming opening portion 15.

Figure 46:
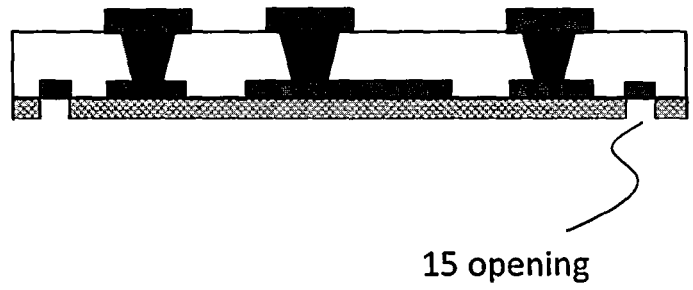
FIG. 46 is a view illustrating a step for forming an opening portion.

In step (S38) of FIG. 37, opening portion 15 is formed in adhesive layer 12. More specifically, as shown in FIG. 46, the adhesive agent at a portion of adhesive layer 12 located under alignment mark 14 is photosensitized and denatured by photolithography, for example. Then, using a removing solution, for example, the photosensitized and denatured portion (12a) is removed, thereby forming opening portion 15 (see FIG. 38).

As described so far, opening portion 15 of the present embodiment is formed by uniformly forming adhesive layer 12 first and by removing part of the adhesive agent. Therefore, opening portion 15 is accurately formed at a predetermined portion while adhesive layer 12 is formed to have a uniform thickness.

Accordingly, electronic component (10a) of the present embodiment is completed as shown in FIG. 38.

The manufacturing method of the present embodiment is suitable for manufacturing electronic component (10a). Using such a manufacturing method, an excellent electronic component (10a) is achieved, in which positional shifting is suppressed between alignment mark 14 and opening portion 15.

To incorporate an electronic component such as another multilayer substrate into a multilayer printed wiring board, a flip-chip bonder may be used. A flip-chip bonder is a device to align an electronic component with respect to a multilayer printed wiring board. Alignment by a flip-chip bonder is carried out based on an alignment mark formed on the electronic component and another alignment mark formed on the multiplayer printed wiring board. For an accurate alignment, it is important to accurately detect the alignment mark formed on the electronic component. A flip-chip bonder is provided with a camera, and alignment marks are detected by the camera.

However, the surface of an alignment mark of an electronic component may be covered by an adhesive agent or the like used for adhering the electronic component to the multilayer printed wiring board. In such a case, when the camera tries to detect the alignment mark, irregular reflection may occur, caused by the filler contained in the adhesive agent. Thus, an accurate detection of the alignment mark may be hindered.

An electronic component according to an embodiment of the present invention has an adhesive layer made of an optically opaque adhesive agent and is provided with an opening, an insulation layer positioned on the adhesive layer, and an alignment mark positioned on the insulation layer and over the upper portion of the opening portion.

A method for manufacturing an electronic component according to another embodiment of the present invention includes the following: preparing a support body; forming an insulation layer on a first main-surface side of the support body; forming an alignment mark on a first main-surface side of the insulation layer; removing the support body; and using an optically opaque adhesive agent, forming an adhesive layer with an opening portion provided on a second main-surface side of the insulation layer and under the alignment mark.

Obviously, numerous modifications and variations of the present invention are possible in light of the above teachings. It is therefore to be understood that within the scope of the appended claims, the invention may be practiced otherwise than as specifically described herein.

What is claimed is:

1. An electronic component, comprising:
    an insulation layer comprising an optically transparent resin material;
    a conductive layer formed on a first surface of the insulation layer and patterned such that the conductive layer comprises an alignment mark and a wiring layer formed on the first surface of the insulation layer; and
    an adhesive layer comprising an adhesive resin material and an optically opaque agent and formed on a second surface of the insulation layer on an opposite side with respect to the first surface of the insulation layer,
    wherein the adhesive layer has an opening portion formed at a position corresponding to the alignment mark such that the opening portion exposes the alignment mark through the insulation layer.

2. An electronic component according to claim 1, wherein the opening portion of the adhesive layer is formed such that the opening portion is extending to an edge portion of the insulation layer.

3. An electronic component according to claim 1, wherein the wiring layer has a wiring pitch which is formed finer than a wiring pitch of a conductive layer formed in a multilayer printed wiring board configured to receive the electronic component.

4. An electronic component according to claim 1, wherein the alignment mark and the wiring layer comprise a plating material.

5. An electronic component according to claim 1, wherein the wiring layer has a wiring pitch which is formed finer than a wiring pitch of a conductive layer formed in a multilayer a printed wiring board configured to receive the electronic component, and the alignment mark and the wiring layer comprise a plating material.

6. An electronic component according to claim 1, further comprising:
   a second insulation layer formed on the insulation layer such that the second insulation layer covers the alignment mark and the wiring layer;
   a conductive pattern formed on the second insulation layer; and
   a via conductor formed through the second insulation layer such that the via conductor is connecting the conductive pattern and the wiring layer.

7. An electronic component according to claim 1, wherein the adhesive layer comprises the optically opaque agent comprising an inorganic filler.

8. An electronic component according to claim 1, wherein the optically opaque agent comprises filler material.

9. A method for manufacturing an electronic component, comprising:
   forming an insulation layer comprising an optically transparent resin material and having a conductive layer patterned such that the conductive layer comprises an alignment mark and a wiring layer on a first surface of the insulation layer;
   forming an adhesive layer comprising an adhesive resin material and an optically opaque agent on a second surface of the insulation layer on an opposite side with respect to the first surface of the insulation layer; and
   forming an opening portion in the adhesive layer at a position corresponding to the alignment mark such that the opening portion exposes the alignment mark through the insulation layer.

10. A method for manufacturing an electronic component according to claim 9, wherein the forming of the insulation layer includes forming the insulation layer comprising an optically transparent layer on a surface of a support body, forming the alignment mark and the wiring layer on the first surface of the insulation layer, and removing the support body from the insulation layer such that the second surface of the insulation layer is exposed.

11. A method for manufacturing an electronic component according to claim 10, wherein the forming of the opening portion comprises removing a portion of the adhesive layer from the position corresponding to the alignment mark by a photolithography.

12. A method for manufacturing an electronic component according to claim 9, wherein the forming of the wiring layer includes forming the alignment mark in a same patterning process.

13. A method for manufacturing an electronic component according to claim 9, wherein the forming of the insulation layer includes forming the wiring layer on the first surface of the insulation layer such that the wiring layer has a wiring pitch which is formed finer than a wiring pitch of a conductive layer formed in a multilayer printed wiring board configured to receive the electronic component.

14. A method for manufacturing an electronic component according to claim 9, wherein the forming of the insulation layer includes forming the wiring layer on the first surface of the insulation layer such that the wiring layer has a wiring pitch which is formed finer than a wiring pitch of a conductive layer formed in a multilayer printed wiring board configured to receive the electronic component, and the forming of the wiring layer includes forming the alignment mark in a same patterning process.

15. A method for manufacturing a multilayer printed wiring board, comprising:
   forming a buildup layer comprising a plurality of insulation layers and a plurality of conductive layers;
   positioning an electronic component having an alignment mark to a position on a surface of the buildup layer based on the alignment mark of the electronic component;
   mounting the electronic component to the surface of the buildup layer in the position; and
   forming an outer insulation layer on the surface of the buildup layer such that the outer insulation layer covers the electronic component mounted on the surface of the buildup layer,
   wherein the electronic component has an insulation layer comprising an optically transparent resin material, a conductive layer formed on a first surface of the insulation layer and patterned such that the conductive layer comprises the alignment mark and a wiring layer positioned on the first surface of the insulation layer, and an adhesive layer comprising an adhesive resin material and an optically opaque agent and formed on a second surface of the insulation layer on an opposite side with respect to the first surface of the insulation layer, and the adhesive layer has an opening portion formed at a position corresponding to the alignment mark such that the opening portion exposes the alignment mark through the insulation layer.

16. A method for manufacturing a multilayer printed wiring board according to claim 15, wherein the buildup layer is formed on a core substrate having a though-hole conductor and a conductive layer.

17. A method for manufacturing an electronic component according to claim 15, wherein the buildup layer is formed on a carrier comprising a support body and a metal foil formed on the support body such that the buildup layer is formed on the metal foil of the carrier.

18. A method for manufacturing an electronic component according to claim 17, further comprising removing the buildup layer from the carrier.

19. A method for manufacturing an electronic component according to claim 15, wherein the electronic component has the wiring layer formed on the first surface of the insulation layer such that the wiring layer has a wiring pitch which is formed finer than a wiring pitch of the conductive layers in the buildup layer.

20. A method for manufacturing an electronic component according to claim 15, wherein the buildup layer has an alignment mark formed therein, the positioning of the electronic component includes positioning a camera device in a space formed between the buildup layer and the electronic component such that the camera device recognizes the alignment mark of the electronic component and the alignment mark of the buildup layer, calculating a relative position of the electronic component with respect to the position on the surface of the buildup layer, and moving the electronic component to the position on the surface of the buildup layer based on the relative position calculated by the camera device.

* * * * *